(12) United States Patent
Koga et al.

(10) Patent No.: US 7,385,849 B2
(45) Date of Patent: Jun. 10, 2008

(54) SEMICONDUCTOR INTEGRATED CIRCUIT DEVICE

(75) Inventors: Mitsuhiro Koga, Yokohama (JP); Hiroshi Shinya, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 147 days.

(21) Appl. No.: 11/512,145

(22) Filed: Aug. 30, 2006

(65) Prior Publication Data

US 2007/0067699 A1    Mar. 22, 2007

(30) Foreign Application Priority Data

Aug. 31, 2005   (JP)   ............................. 2005-251118

(51) Int. Cl.
 *G11C 11/34* (2006.01)
(52) U.S. Cl. ............................. 365/185.22; 365/238.5; 365/230.06
(58) Field of Classification Search ........... 365/185.22, 365/238.5, 230.06, 200, 222, 189.07, 185.25
See application file for complete search history.

(56) References Cited

U.S. PATENT DOCUMENTS 5,127,014 A * 6/1992 Raynham .................... 714/754
6,957,378 B2   10/2005 Koga et al.
7,158,433 B2 *  1/2007 Riho et al. .................. 365/222
2005/0005230 A1  1/2005 Koga et al.
2005/0036371 A1  2/2005 Kushida

FOREIGN PATENT DOCUMENTS

JP        2005-25827        1/2005

* cited by examiner

*Primary Examiner*—Dang T Nguyen
(74) *Attorney, Agent, or Firm*—Oblon, Spivak, McClelland, Maier & Neustadt, P.C.

(57) ABSTRACT

A semiconductor integrated circuit device is disclosed. The device includes a memory cell array, an I/O buffer, a read/write buffer, an error checking and correcting circuit, and an initialization checking circuit. N-bit data is input to the I/O buffer and the I/O buffer outputs N-bit data. The I/O buffer inputs N-bit data to the read/write buffer, and the read/write buffer outputs N-bit data to the I/O buffer. The memory cell array inputs up to M×N-bit data to the read/write buffer, and the read/write buffer outputs up to M×N-bit data to the memory cell array. The read/write buffer writes a variable number of bits to the memory cell array (N is a natural number equal to or larger than 1, and M is a natural number equal to or larger than 2).

12 Claims, 18 Drawing Sheets

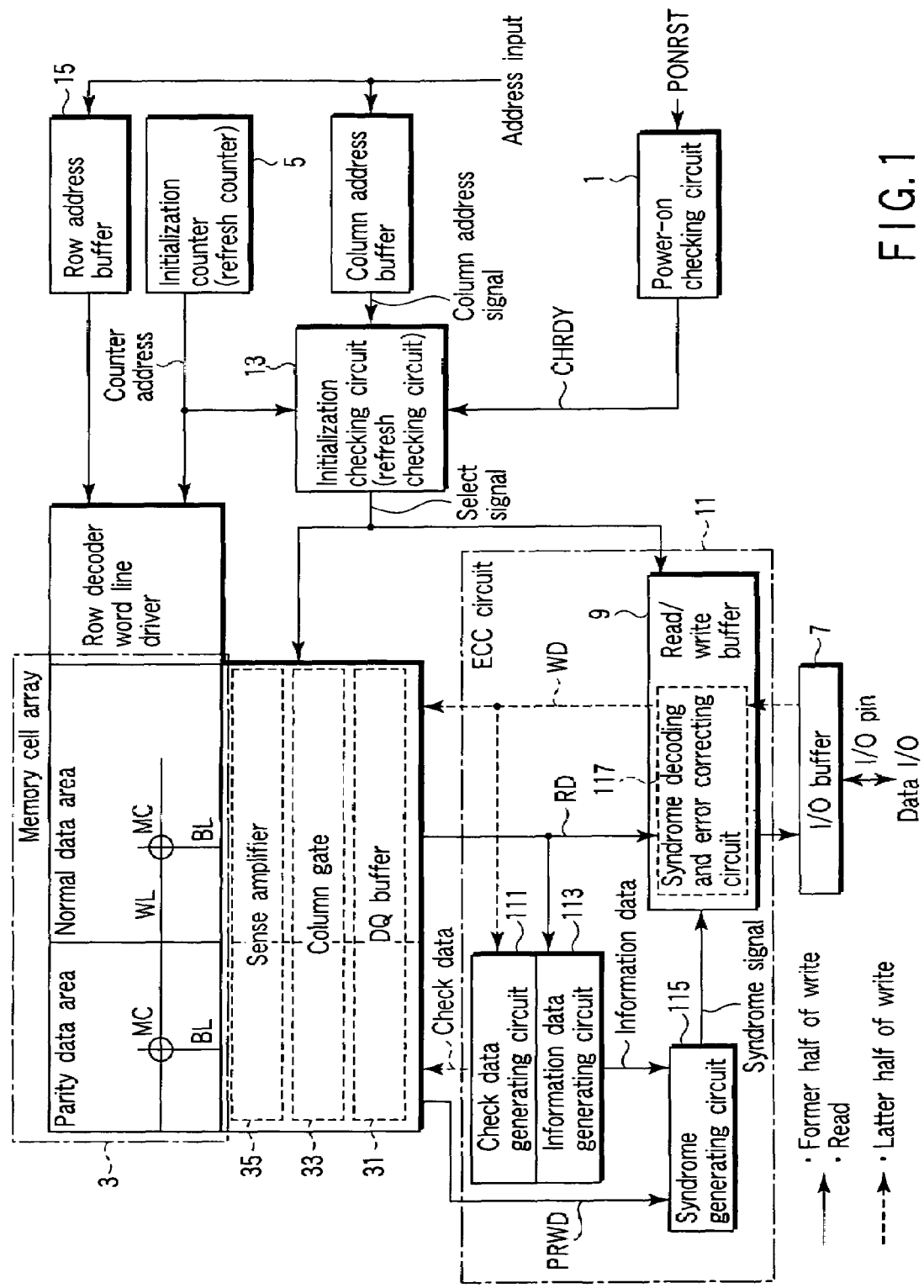
F I G. 1

Operational flow according to first embodiment

Not all memory cells have been refreshed

All memory cells have been refreshed

143

A: Decode function disable/enable signal {Low: disable / High: enable}

B: Refresh completion signal {High: Refresh uncompleted / Low: Refresh completed}

Operational flow according to second embodiment

A : Decode function disable/enable signal {Low : disable / High : enable}

B : Refresh completion signal {High : Refresh uncompleted / Low : Refresh completed}

C : Error monitor signal {Low : No error detected / High : Error detected}

If no error is detected, Syndrome<0 : 7> = ALL Low
If any error is detected, Syndrome<0 : 7> ≠ ALL Low 201 Error monitor signal generating circuit

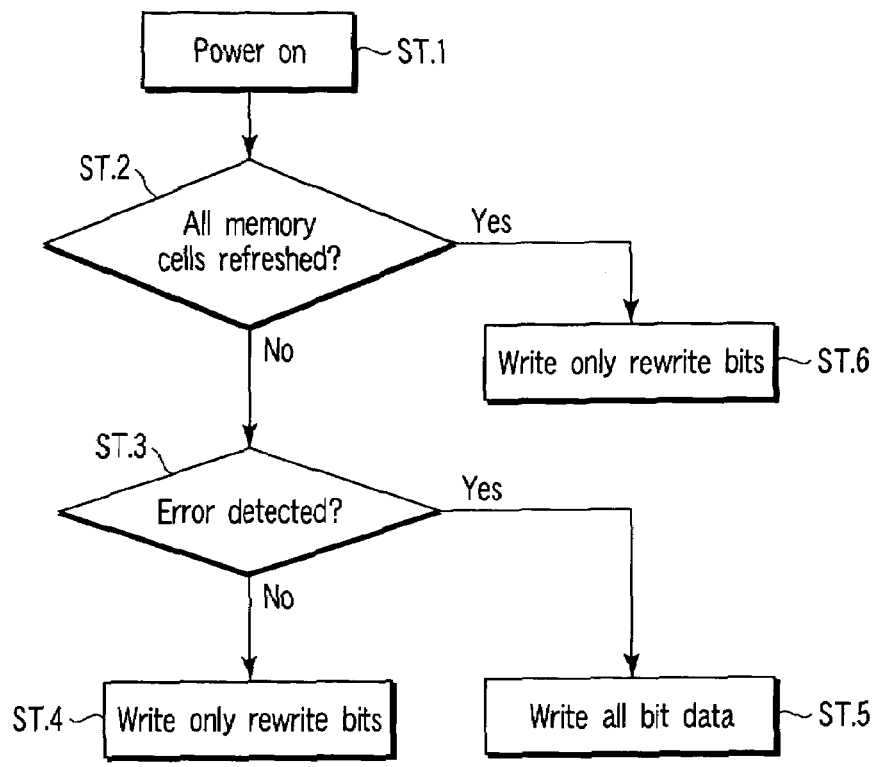

Operational flow according to third embodiment

FIG. 16

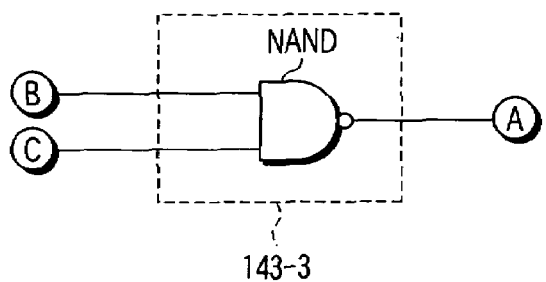

A : Decode function disable/enable signal $\begin{cases} \text{Low : disable} \\ \text{High : enable} \end{cases}$ B : Refresh completion signal $\begin{cases} \text{High : Refresh uncompleted} \\ \text{Low : Refresh completed} \end{cases}$ C : Error monitor signal $\begin{cases} \text{Low : No error detected} \\ \text{High : Error detected} \end{cases}$

FIG. 17

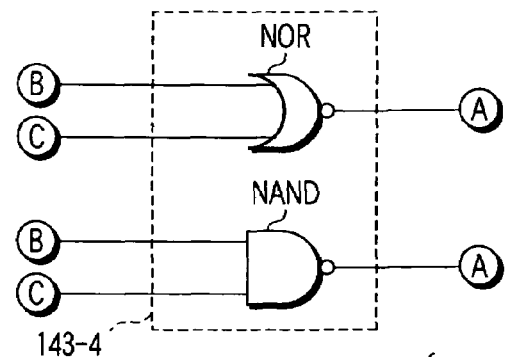

A : Decode function disable/enable signal { Low : disable / High : enable

B : Refresh completion signal { High : Refresh uncompleted / Low : Refresh completed C : Error monitor signal { Low : No error detected / High : Error detected

FIG. 18

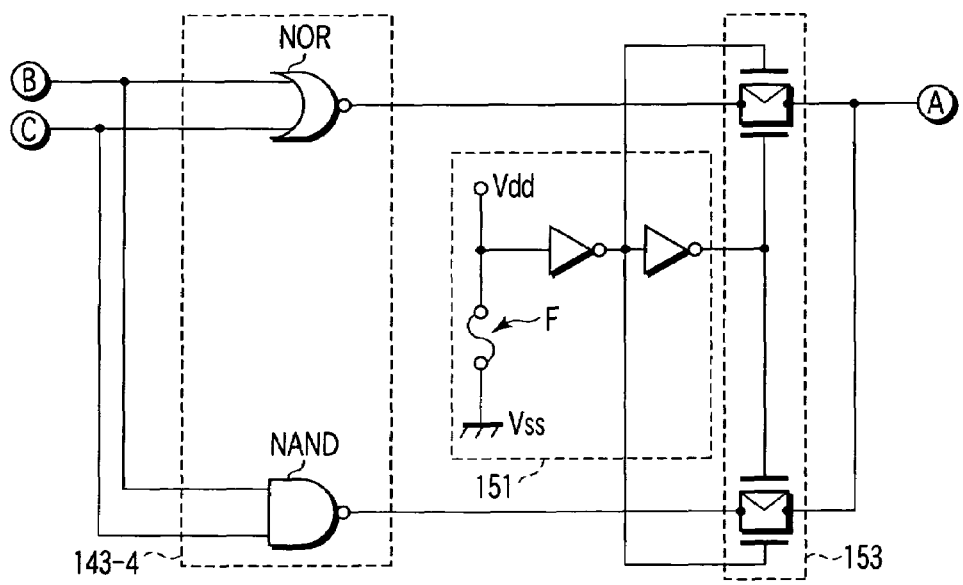

A : Decode function disable/enable signal { Low : disable / High : enable

B : Refresh completion signal { High : Refresh uncompleted / Low : Refresh completed C : Error monitor signal { Low : No error detected / High : Error detected F : Fuse { Cut : Select second embodiment / Non-cut : Select third embodiment

FIG. 19

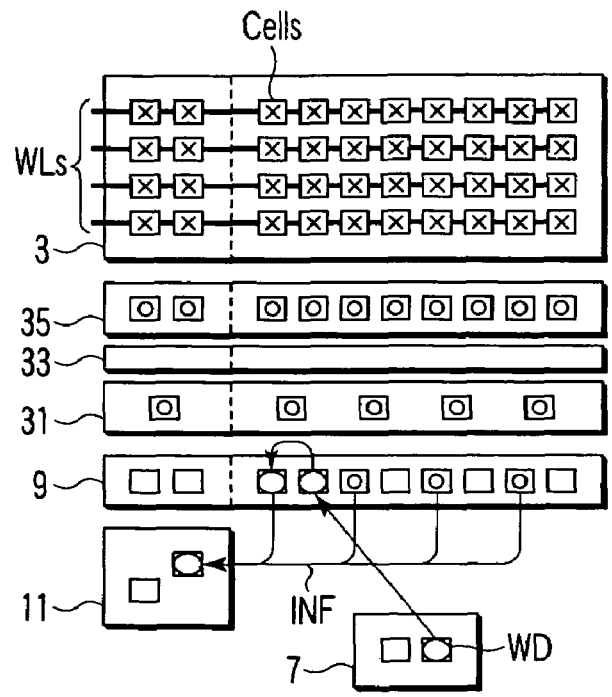
F I G. 22E
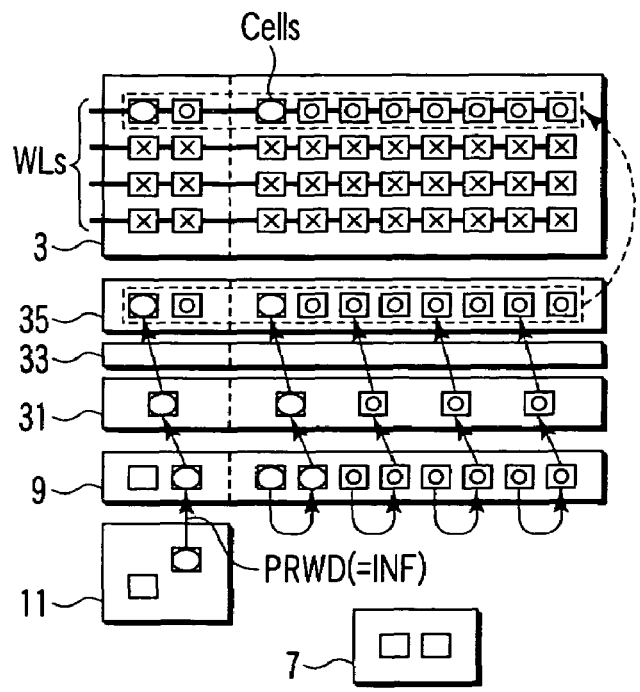
F I G. 22F

SEMICONDUCTOR INTEGRATED CIRCUIT DEVICE

CROSS-REFERENCE TO RELATED APPLICATIONS

This application is based upon and claims the benefit of priority from prior Japanese Patent Application No. 2005-251118, filed Aug. 31, 2005, the entire contents of which are incorporated herein by reference.

BACKGROUND OF THE INVENTION

1. Field of the Invention

The present invention relates to a semiconductor integrated circuit device, and in particular, to a semiconductor integrated circuit device having a semiconductor memory comprising an error checking and correcting circuit.

2. Description of the Related Art

It is important for memories with error checking and correcting (ECC) circuits to make ECC operations invisible to minimize adverse effects on write/read accesses. The ECC operation may result in a useless access. Methods for minimizing the adverse effects on write/read accesses are roughly classified into:

(1) a type of method for performing an ECC operation during a cycle that does not relate to original write/read accesses, and (2) a type of method for performing an ECC operation with its adverse effects on accesses minimized.

For example, data the number of which is larger than that of I/O data are collectively read from a memory cell array. An ECC operation is performed on these data, which are then held in a temporary storage such as a register. A write/read operation is then continuously performed. Such an operation in combination with a continuous operation in a page or burst mode is more effective. However, larger power consumption results from an ECC operation performed on data the number of which is larger than that of I/O data.

Such a method is disclosed in Jpn. Pat. Appln. KOKAI Publication No. 2005-25827.

BRIEF SUMMARY OF THE INVENTION

A semiconductor integrated circuit device according to an aspect of the present invention comprises a power-on checking circuit which detects power-on, a memory cell array in which memory cell arrays are integrated, an initialization counter which sequentially counts addresses of the memory cell arrays and which initializes data in the memory cells integrated in the memory cell array in accordance with the counter, an I/O buffer to which N-bit data is input and which outputs N-bit data (N is a natural number equal to or larger than 1), a read/write buffer configured to hold M×N-bit data and to which the I/O buffer inputs N-bit data at a time and which outputs N-bit data to the I/O buffer at a time, the memory cell array inputting up to M×N-bit data to the read/write buffer, the read/write buffer outputting up to M×N-bit data to the memory cell array, the read/write buffer writing a variable number of bits to the memory cell array (M is a natural number equal to or larger than 2), an error checking and correcting circuit which checks whether or not an error is detected in the M×N-bit data from the memory cell array and which, when an error is detected, corrects the detected error, and an initialization checking circuit which, after the power-on checking circuit detects power-on, determines whether or not the initialization counter has initialized the data in all the memory cells.

BRIEF DESCRIPTION OF THE SEVERAL VIEWS OF THE DRAWING

FIG. 1 is a block diagram showing the exemplary configuration of a semiconductor integrated circuit device according to a first embodiment of the present invention;

FIG. 16 is a flowchart showing the exemplary operational flow of a semiconductor integrated circuit device according to a third embodiment of the present invention;

FIG. 17 is a circuit diagram showing an exemplary logic gate circuit used in the third embodiment;

FIG. 18 is a circuit diagram showing an exemplary logic gate circuit used in a fourth embodiment;

FIG. 19 is a circuit diagram showing an exemplary logic gate circuit used in a variation of the fourth embodiment and an exemplary peripheral circuit;

FIGS. 22A to 22F are diagrams showing that a data write operation is performed during an initializing operation of the semiconductor integrated circuit device according to the fifth embodiment.

DETAILED DESCRIPTION OF THE INVENTION

Figure 2:
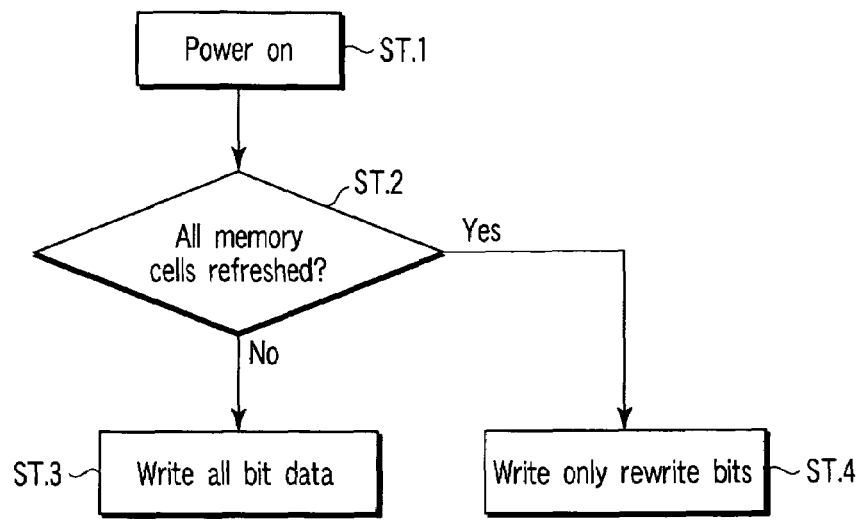
FIG. 2 is a flowchart showing the exemplary operational flow of the semiconductor integrated circuit device according to the first embodiment of the present invention.

Embodiments of the present invention will be described with reference to the drawings. In the description, components common to all the drawings are denoted by common reference numerals.

First Embodiment

FIG. 1 is a block diagram showing the exemplary configuration of a semiconductor integrated circuit device according to a first embodiment of the present invention.

As shown in FIG. 1, the semiconductor integrated circuit device according to the first embodiment comprises a power-on checking circuit 1, a memory cell array 3, an initialization counter 5, an I/O buffer (I/O buffer) 7, a read/write buffer 9, an error checking and correcting circuit 11, and an initialization checking circuit 13.

The power-on checking circuit 1 detects power-on. The power-on checking circuit in the present example detects power-on when a power-on reset signal is input, and outputs a power-on checking signal CHARY that activates the integrated circuit device.

Memory cells are integrated in the memory cell array 3. The memory cell array 3 in the present example has a normal data area and a parity data area. Normal data is stored in the normal data area. Check data is stored in the parity data area. The normal data is input by an apparatus outside the integrated circuit device and is, for example, write data. The check data is required to check, after write data is read, whether or not the correct data has been read (whether or not an error has occurred). Memory cells MC in the present example are of a dynamic type. Dynamic memory cells, for example, hold data by charges accumulated in capacitors and the data is volatile. These memory cells are used, for example, for dynamic RAMs (DRAMs) and pseudo static RAMs (pseudo SRAMs).

The initialization counter 5 sequentially counts the addresses in the memory cell array 3 and initializes the data in the memory cells on the basis of the count. Since the memory cells in the present example are of the dynamic type, data needs to be refreshed. Thus, the initialization counter 5 in the present example also operates as a refresh counter. A refresh operation may be either self refresh that executes refreshing under only the internal control of a chip or extra or auto refresh that executes refreshing under the control of an apparatus outside the chip.

The I/O buffer 7 transmits and receives data to and from an apparatus outside the integrated circuit device. The number of I/O data in the present example is N bits (N is a natural number equal to or larger than 1). The apparatus outside the integrated circuit device inputs N-bit data to the I/O buffer 7 at a time. The I/O buffer 7 outputs N-bit data to the apparatus outside the integrated circuit device at a time. An example of the N bits is 16 bits (=1 word).

The read/write buffer 9 is a temporary storage circuit that can hold data the number of which is larger than that of data input to and output from the I/O buffer 7. An example of the temporary storage circuit is a register. The read/write buffer 9 in the present example can hold M×N-bit data (M is a natural number equal to larger than 2). An example of M is a burst length (B. L.). In the present example, B. L. is assumed to be "4" by way of example. The read/write buffer 9 in the present example can hold M×N-bit data=4×16-bit data=64-bit data. The I/O buffer 7 inputs N-bit (16-bit) data to the read/write buffer 9 at a time. The read/write buffer 9 outputs N-bit (16-bit) data to the I/O buffer 7 at a time. The normal data area of the memory cell array 3 inputs at least N-bit (16-bit) and at most M×N-bit (=64-bit) data to the read/write buffer 9 at a time. The read/write buffer 9 outputs at least N-bit (16-bit) and at most M×N-bit (=64-bit) data to the normal data area of the memory cell array 3 at a time.

The error checking and correcting circuit 11 checks whether or not an error is occurring in M×N-bit (=64-bit) data read from the normal data area of the memory cell array 3. When an error is detected, the error checking and correcting circuit 11 corrects the found error. An error correction code is used to check and correct an error. An example of the error correction code is a Hamming code. Error checks and corrections using the Hamming code enable, for example, single error corrections. Specifically, the error checking and correcting circuit 11 has a check data generating circuit data generating circuit 111, an information data generating circuit 113, a syndrome generating circuit 115, and a syndrome decoding and error correcting circuit 117.

The check data generating circuit 111 generates check data used for error checks and corrections. The check data is generated from M×N-bit (=4×16-bit=64-bit) normal data (WD) containing N-bit write data. An example of the number of bits is 8. The normal data (WD) is output by the read/write buffer 9. All the bits or N bits (=write data) of the normal data (WD) are written to the normal data area via a DQ buffer 31, a column gate 33, and a sense amplifier 35. Check data generated is written to the parity data area via the DQ buffer 31, column gate 33, and sense amplifier 35. On this occasion, M×N-bit normal data (WD) and check data or N-bit write data and check data are written to the same row specified by a row address buffer 15.

The information data generating circuit 113 generates information data used for error checks and corrections. The information data is generated from M×N-bit normal data (RD). The normal data is output by the normal data area via the DQ buffer 31, column gate 33, and sense amplifier 35.

The syndrome generating circuit 115 generates a syndrome signal on the basis of information data generated from the normal data (RD) and check data read from the same row as that which contains the normal data (RD).

If the normal data (RD) has an error, the syndrome decoding and error correcting circuit 117 corrects it in accordance with a syndrome signal. The corrected normal data (RD) is held in the read/write buffer 9.

The initialization checking circuit 13 determines whether or not the initialization counter 5 has completely initialized the data in the memory cells, after the power-on checking circuit 1 has detected power-on.

<Exemplary Operations>

A read operation of the device according to the present invention may be similar to that of the device described in Jpn. Pat. Appln. KOKAI Publication No. 2005-25827 (U.S. patent application Ser. No. 10/878,229, filed on Jun. 29, 2004, the entire contents of which are incorporated herein by reference). Accordingly, only a write operation will be described below.

FIG. 2 is a flowchart showing the exemplary operational flow of the semiconductor integrated circuit device according to the first embodiment of the present invention.

The device according to the first embodiment varies the number of data bits written to the normal data area of the memory cell array 3 during a write operation, between before and after initialization.

For example, as shown in FIG. 2, power-on is detected (ST. 1). The initialization checking circuit 13 determines whether or not all the memory cells have been initialized, in the present example, whether or not all memory cells have been refreshed (ST. 2).

If not all the memory cells have been refreshed (No), all the bits of the M×N-bit normal data (WD) including N-bit write data are written to the normal data area of the memory cell array 3 (ST. 3: write all bit data).

In contrast, if all the memory cells have been refreshed (Yes), only the N-bit write data of the M×N-bit normal data (WD) is written to the normal data area of the memory cell array 3 (ST. 4: write only rewrite bits).

A specific example of a write operation is shown in FIGS. 3 to 8. A read operation is similar to the procedure shown in FIGS. 3 to 6 and its description is omitted.

Figure 3:
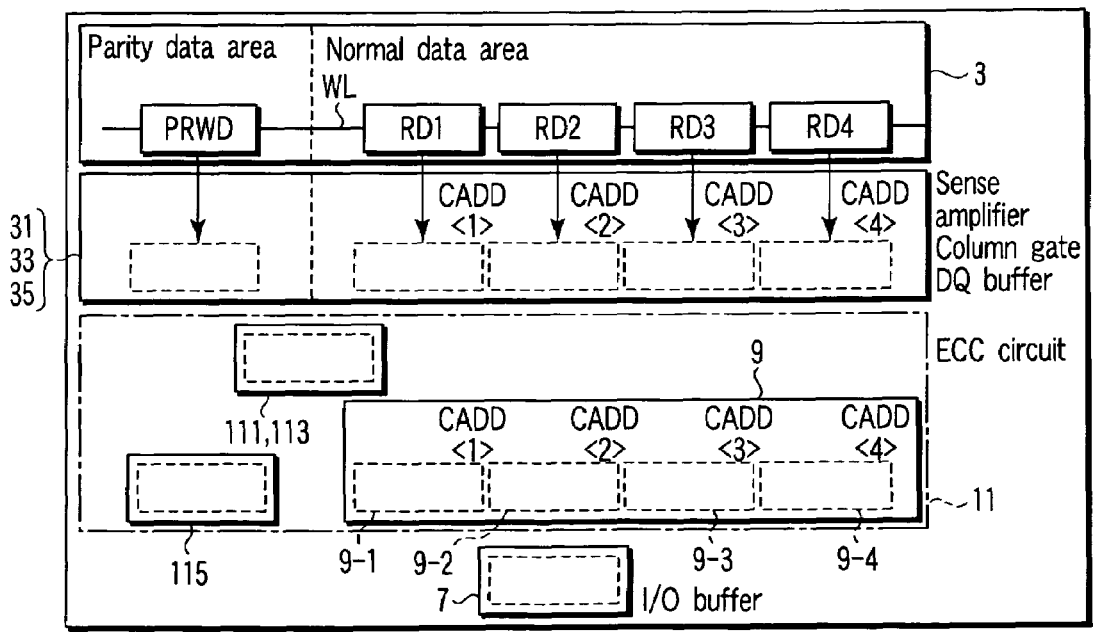
FIG. 3 is a diagram showing an exemplary write operation of the semiconductor integrated circuit device according to the first embodiment of the present invention.

First, as shown in FIG. 3, a word line WL is selected, and M×N-bit (in the present example, 4×16-bit=64-bit) normal data (RD1 to RD4) from the normal data area. Further, check data (PRWD; in the present example, 8 bits) is read from the parity data area.

Figure 4:
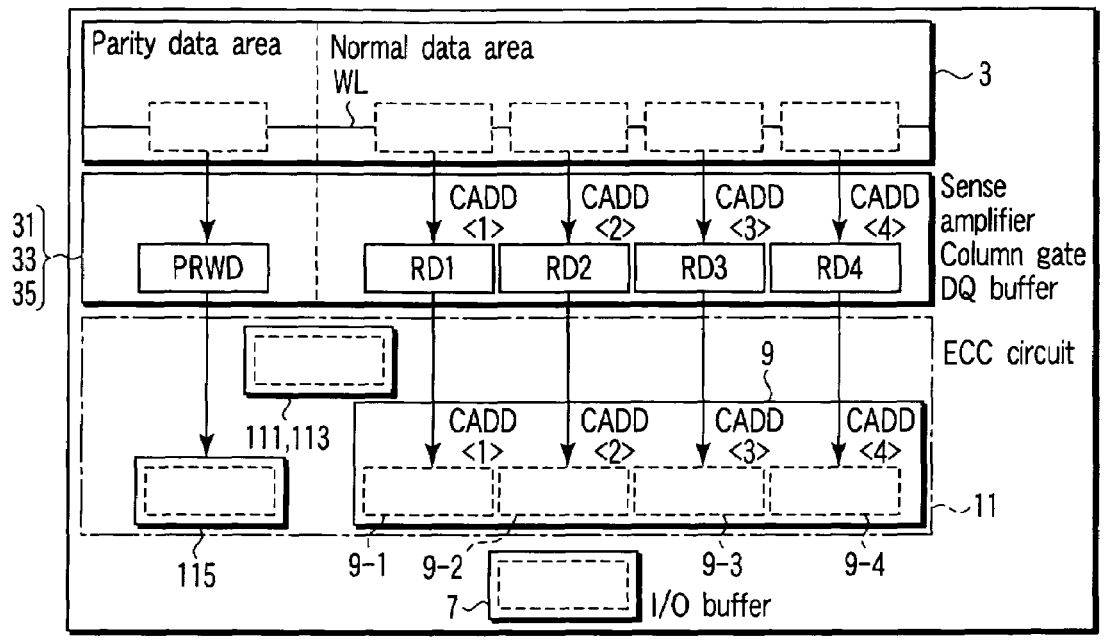
FIG. 4 is a diagram showing an exemplary write operation of the semiconductor integrated circuit device according to the first embodiment of the present invention.

Then, as shown in FIG. 4, the normal data (RD1 to RD4) and check data (PRWD) are amplified and restored by the sense amplifier. The restored data are further amplified by the DQ buffer via the column gate.

Figure 5:
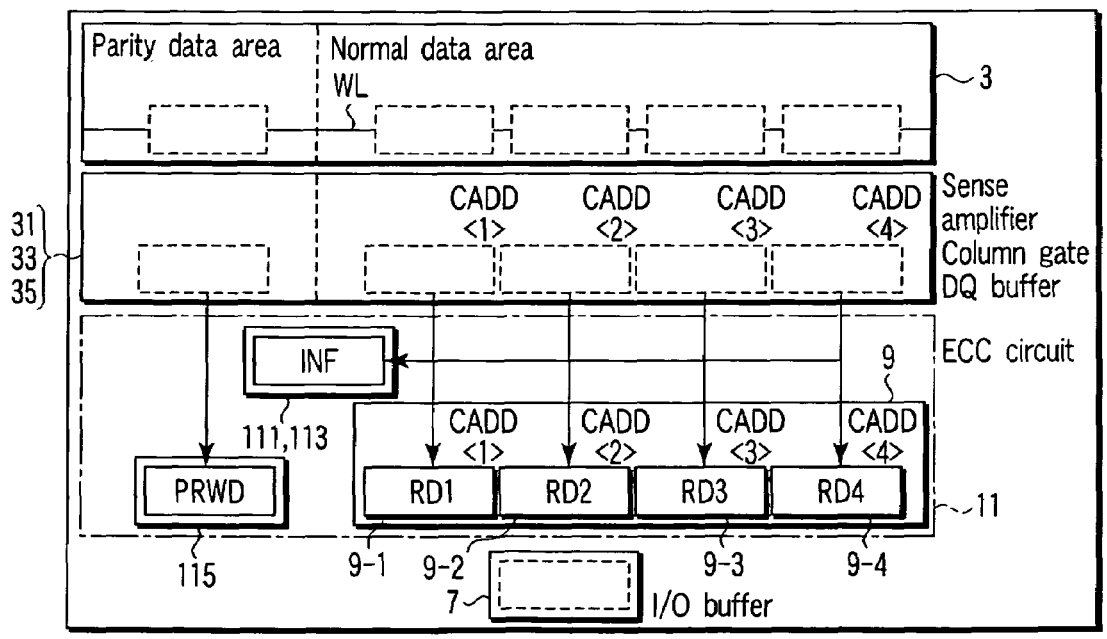
FIG. 5 is a diagram showing an exemplary write operation of the semiconductor integrated circuit device according to the first embodiment of the present invention.

Then, as shown in FIG. 5, information data (INF) is generated from the normal data (RD1 to RD4) amplified by the DQ buffer.

Figure 6:
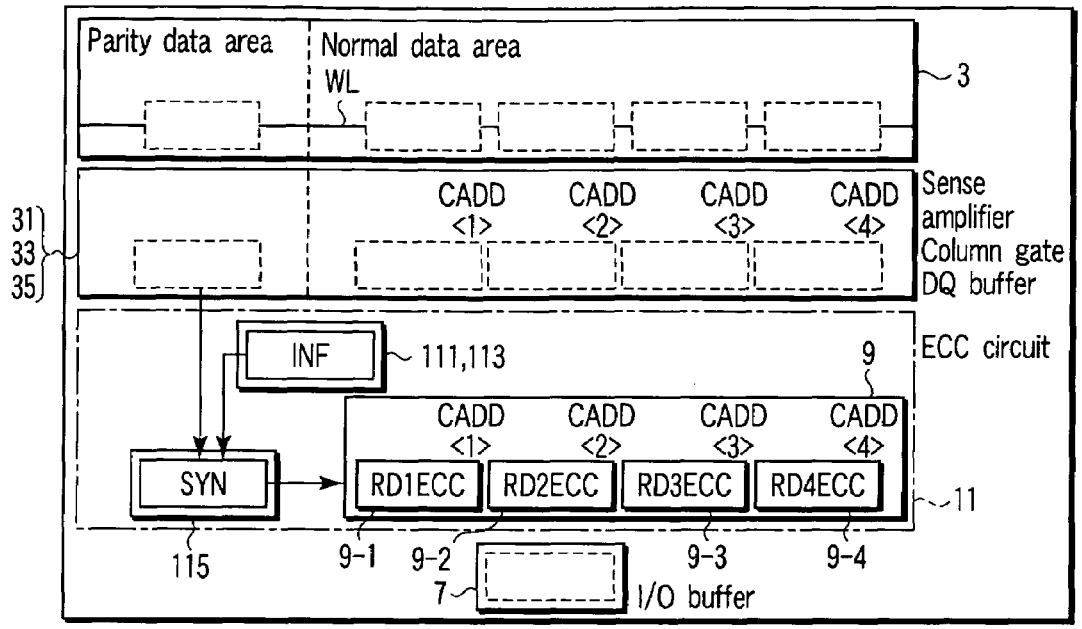
FIG. 6 is a diagram showing an exemplary write operation of the semiconductor integrated circuit device according to the first embodiment of the present invention.

Then, as shown in FIG. 6, a syndrome signal (SYN) is generated on the basis of the check data (PRWD) and information data (INF). Then, the normal data (RD1 to RD4) is subjected to error checks and corrections in accordance with the syndrome signal. The normal data (RD1ECC to RD4ECC) subjected to the error checks and corrections is held in the read/write buffer 9.

Figure 7:
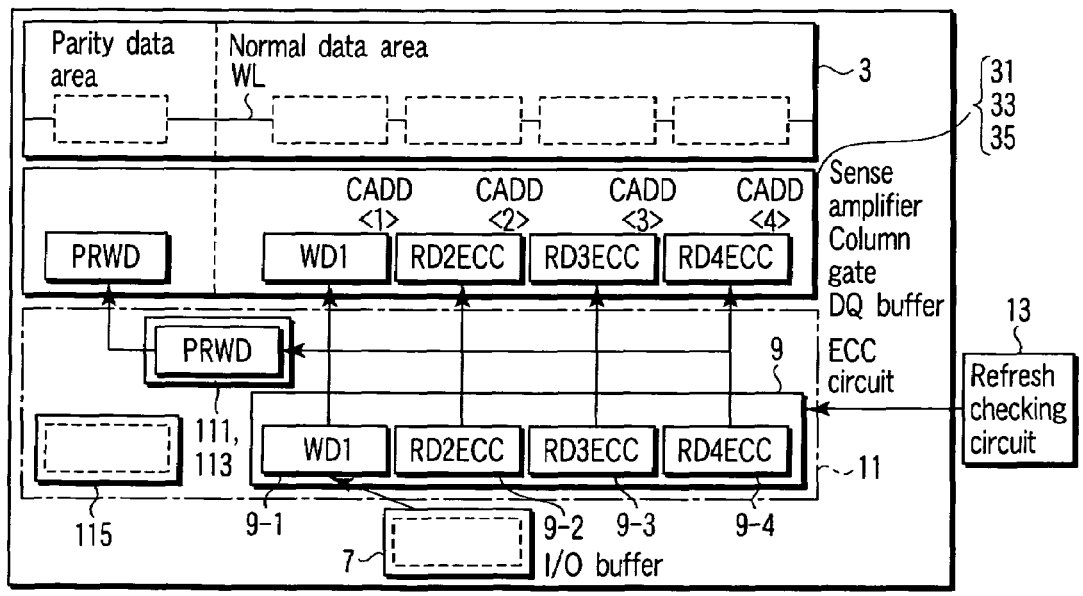
FIG. 7 is a diagram showing an exemplary write operation of the semiconductor integrated circuit device according to the first embodiment of the present invention.
Figure 8:
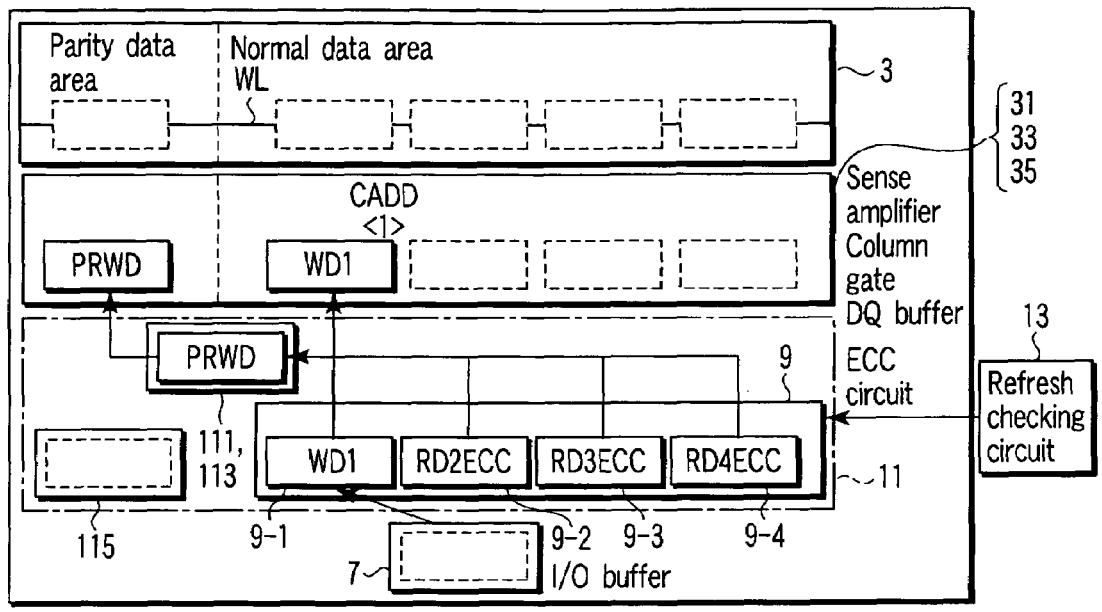
FIG. 8 is a diagram showing an exemplary write operation of the semiconductor integrated circuit device according to the first embodiment of the present invention.

Then, as shown in FIG. 7 or 8, the N-bits (RD1ECC) of the normal data (RD1ECC to RD4ECC) held in the read/write buffer 9 are replaced with write data (WD1) held in the I/O buffer 7. Check data (PRWD) is then generated from the M×N-bit normal data (WD1 and RD2ECC to RD4ECC) including the N-bit write data.

If not all the memory cells have been refreshed, then as shown in FIG. 7, all of the M×N-bit normal data (WD1 and RD2 ECC to RD4ECC) including the N-bit write data is written to the normal data area. The check data is written to the parity data area.

In contrast, if all the memory cells have been refreshed, then as shown in FIG. 8, only the N-bit write data (WD1) of the M×N-bit normal data (WD1 and RD2 ECC to RD4 ECC) is written to the normal data area. The check data is written to the parity data area.

Thus, the first embodiment varies the number of data bits written to the normal data area of the memory cell array 3 during a write operation, between before and after initialization.

In particular, according to the first embodiment, if not all the memory cells have been refreshed after detection of power-on, all the data bits are written to the normal data area. If all the memory cells have been refreshed, only the rewrite data bits are written to the normal data area.

Writing only the rewrite bits to the normal data area has the advantage of, for example, reducing the number of DQ buffers 31 and the like to be activated compared to writing all the data bits to the normal data area. This enables a reduction in power consumption.

However, in the first embodiment, if not all the memory cells have been refreshed, all the data bits are written to the normal data area. This is because immediately after power-on, the data held in the memory cells in the normal and parity data areas cannot be identified, so that incorrect error checks and corrections may be executed.

If the data cannot be identified, check data read from the parity data area immediately after power-on is not necessarily correct for normal data read from the normal data area. The incorrect check data may be used to execute useless error checks and corrections on the normal data read from the normal data area. The execution of the useless error checks and corrections makes the 64-bit normal data held in the normal data area different from the 64-bit normal data held in the read/write buffer 9. Of course, for example, 16-bits of the 64-bit (=4×16-bit) data held in the read/write buffer 9 are replaced with write data, so that this part may be different from the corresponding part in the normal data area. However, the remaining 48 bits are still subject to the effects of the useless error checks and corrections.

New check data is generated from 64-bit data composed of the 48-bit data on which the useless checks and corrections have been executed plus 16-bit write data. The new check data is then written to the parity data area.

It is assumed that only the 16-bit write data is written to the normal data area and that the remaining 48 bits are not rewritten. Under this assumption, the check data is almost always different from the 64-bit normal data held in the normal data area. This is because the useless error checks and corrections have been executed on the data except the write data, that is, the 48-bit data.

It is assumed that the rewritten 16-bit data is read together with the non-rewritten 48-bit data. The information is generated from this 64-bit data. Only the 16-bit write data is to be read. In this case, no problem occurs provided that the correct error checks and corrections are executed only on the 16-bit write data. Of course, if no error is detected in the 16-bit write data, no error checks and corrections need be executed. However, if an error is detected in the data except the write data, that is, the 48-bit data and the 64-bit data is corrected on the basis of the error, then incorrect error checks and corrections are often executed on the 16-bit write data of the 64-bit data.

For example, when the Hamming code is used to execute single error corrections for error checks and corrections, if at least two errors are occurring (multibit error or multiple error), then instead of the 2 or more bits in which the errors are occurring, totally different bits may be corrected depending on the combination of the 2 or more bits. No problem occurs if these corrections are placed in, in the present example, the data except the write data, that is, the 48 bits. However, if the corrections are placed in the 16-bit write data, the write data may be made incorrect.

The incorrect error checks and corrections caused by the multiple error is unlikely to occur because in normal operations, errors occur in few bits, which need to be corrected. However, the increased number of bits in which errors occur increases the probability of incorrect error checks and corrections caused by a multiple error. If the data held in the normal and parity data areas cannot be identified as in the case of the memory cells immediately after power-on as described above, more bits need to be corrected than expected for normal operations. In other words, immediately after power-on, a multiple error is likely to occur, which increases the probability of incorrect error checks and corrections caused by the multiple error.

To avoid incorrect error checks and corrections caused by a multiple error, the first embodiment writes all the data bits to the normal data area if not all the memory cells have been refreshed. This reduces the probability of executing incorrect error checks and corrections on the write data.

Thus, the first embodiment writes all the data (in the present example, 64 bits) held in the read/write buffer 9, to the normal data area if not all the memory cells have been refreshed. This avoids executing incorrect error checks and corrections on the write data immediately after power-on. The semiconductor memory can thus be kept reliable.

Once all the memory cells are refreshed, the rewritten part (in the present example, 16 bits) of the data held in the read/write buffer 9 is written to the normal data area. This reduces power consumption.

Now, an exemplary initialization checking circuit will be described.

Figure 9:
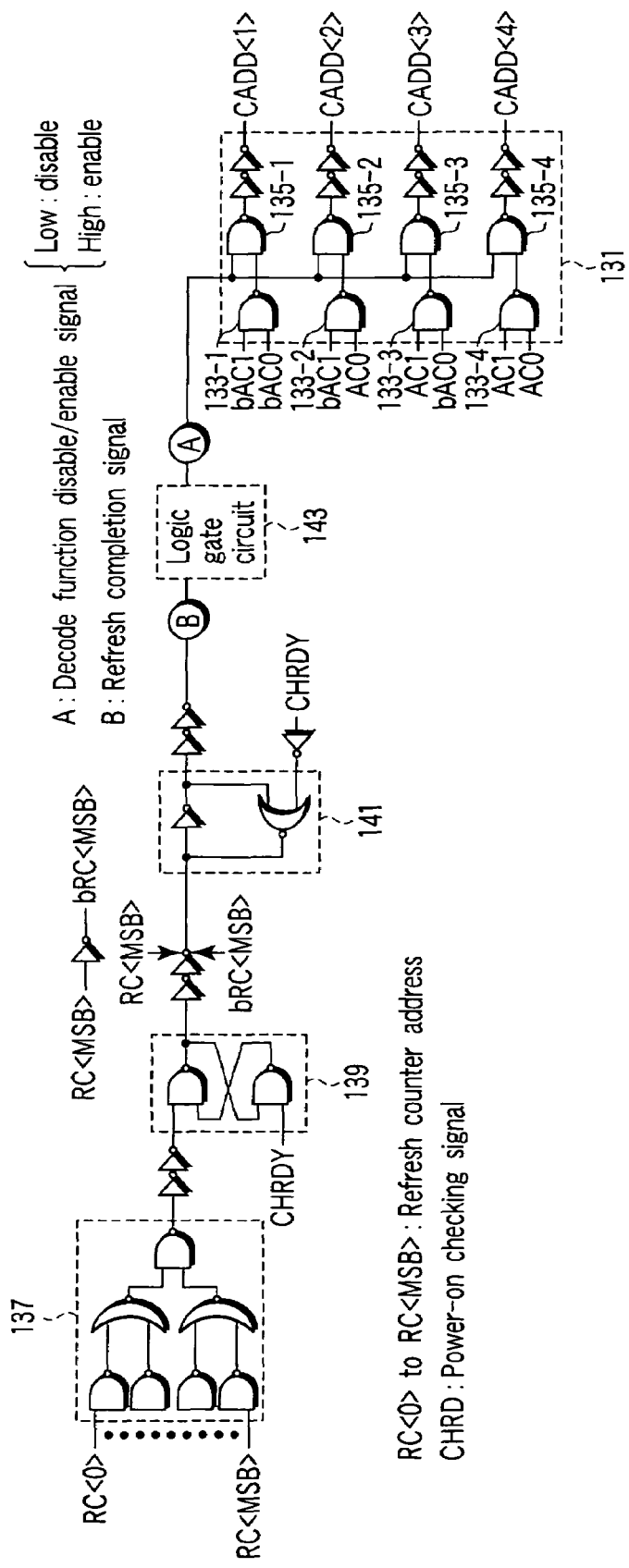
FIG. 9 is a circuit diagram showing an example of an initialization checking circuit shown in FIG. 1.

FIG. 9 is a circuit diagram showing an example of the initialization checking circuit 13, shown in FIG. 1.

As shown in FIG. 9, the initialization checking circuit 13, shown in FIG. 1, checks whether or not all the memory cells have been refreshed. The initialization checking circuit 13 will be referred to as a refresh checking circuit 13 below.

The refresh checking circuit 13 checks whether or not counter addresses, in the present example, refresh counter addresses RC<0> to RC<MSB> have been counted up from the first to final addresses after detection of power-on. On the basis of the check result, the refresh checking circuit 13 determines whether all or part of the read/write buffer 9 is connected to the normal data area.

The connection is determined by select signals CADD<1> to CADD<M>, in the present example, CADD<1> to CADD<4>. The select signals CADD<1> to CADD<4> select an electric path that connects read/write buffers 9-1 to 9-4 shown in FIGS. 3 to 8 to the normal data area.

The select signals CADD<1> to CADD<4> in the present example are output by a decode circuit 131. The decode circuit 131 decodes a column address signal AC, in the present example, column address signals AC0 and AC1, to generate select signals CADD<1> to CADD<4>. In the present example, one of the select signals CADD<1> to CADD<4> is made high level on the basis of the logic of the column address signals AC0 and AC1. This corresponds to a basic operation. One of the select signals CADD<1> to CADD<4> which has been made high level selects one of the four electric paths connecting the read/write buffers 9-1 to 9-4 to the normal data area.

However, the refresh checking circuit 13 make all the select signals CADD<1> to CADD<4> high level regardless of logic of the column address signals AC0 and AC1 until the refresh counter address, starting from RC<0>, reaches RC<MSB>. This selects all of the four electric paths connecting the read/write buffers 9-1 to 9-4 to the normal data area.

Specifically, the refresh checking circuit 13 disables the decode function of the decode circuit 131 until the refresh counter address RC<0> to RC<MSB> reaches the final value. Once the refresh counter address RC<0> to RC<MSB> reaches the final value, the decode function is enabled. Thus, before and after all the memory cells are refreshed, all the select signals CADD<1> to CADD<4> may be selected or one of them may be selected on the basis of the logic of the column address signals AC0 and AC1.

In the present example, a decode function disable/enable signal disables or enables the decode function. In the present example, the decode function is disabled while the decode function disable/enable signal A is low level, and is enabled while the decode function disable/enable signal A is high level. Specifically, the decode function disable/enable signal A is input to one of the two terminals of each circuit of a logic gate circuit group 135-1 to 135-4; each of the logic circuits 135-1 to 135-4 is connected to the output of a corresponding circuit of a group of logic gate circuits 133-1 to 133-4 that decode the column address signals AC0 and AC1. In the present example, the logic gate circuits 135-1 to 135-4 are NAND gate circuits and all their outputs go high level regardless of outputs from the logic gate circuits 133-1 to 133-4. In contrast, when the decode function disable/enable signal A is made high level, the logic gate circuits 135-1 to 135-4 change their outputs high or low level depending on the outputs from the logic gate circuits 133-1 to 133-4.

The decode function disable/enable signal A is generated with reference to the refresh counter address RC<0> to RC<MSB>. The refresh counter address RC<0> to RC<MSB> is output by the initialization counter (refresh counter) 5.

In the present example, the refresh counter address RC<0> to RC<MSB> is input to a counter address detecting circuit 137. When all the refresh counter addresses RC<0> to RC<MSB> are high level, the counter address detecting circuit 137 in the present example makes its counter address detection output low level. Otherwise, the counter address detection output is high level. The counter address detection output is input to a flip flop circuit 139 that provides an output input to a latch circuit 141.

The flip flop circuit 139 in the present example is composed of cross-coupled NAND gate circuits and stores a change in counter address detection output from high to low level.

For example, when the counter address detection output is made high level, with the power-on checking signal CHRDY made low level, the flip flop circuit 139 is reset to change its output to low level. The power-on checking signal CHRDY subsequently changes from the low to high level. However, the flip flop circuit 139 is in a hold state to keep its output low level. The power-on checking signal CHRDY subsequently changes high to low level. The flip flop circuit 139 is then set to change its output from low to high level. The flip flop circuit 139 subsequently holds high level output while the power-on checking signal CHDRY, regardless of a change in counter address detection output.

In other words, in the present example, the low level output from the flip flop circuit indicates that the refreshing is not completed. A change in output to high level indicates that the refreshing is completed.

The latch circuit 141 latches the output from the flip flop circuit 139. The output from the latch circuit 141 in the present example is a refresh completion signal B.

The refresh completion signal B in the present example is an inverted output from the flip flop circuit 139. Accordingly, the high refresh completion signal B indicates that the refreshing is not completed. In contrast, a change from the high to low level indicates that the refreshing is completed.

Figure 10:
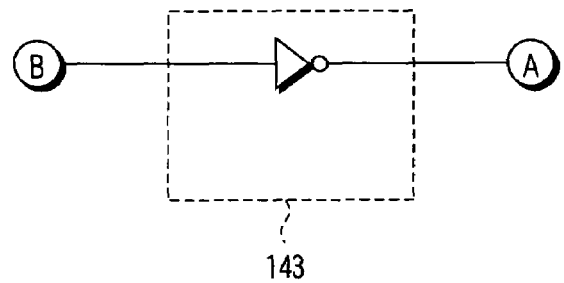
FIG. 10 is a circuit diagram showing an exemplary logic gate circuit used in the first embodiment.

The logic gate circuit 143 generates the above decode function disable/enable signal A from the refresh completion signal B. FIG. 10 shows an example of the logic gate circuit 143 in the present example. As shown in FIG. 10, the logic gate circuit 143 in the present example is an inverter gate circuit. Accordingly, the decode function disable/enable signal A corresponds to the inverted refresh completion signal B.

As described above, while the decode function disable/enable signal A is low level, that is, before the refreshing is completed, all the select signals CADD<1> to CADD<4> are high level and are selected.

In contrast, while the decode function disable/enable signal A is high level, that is, after the refreshing is completed, the select signals CADD<1> to CADD<4> are high or low level in accordance with the column address signals AC0 and AC1 as described above. Consequently, one of the select signals CADD<1> to CADD<4> is selected.

Second Embodiment

Figure 11:
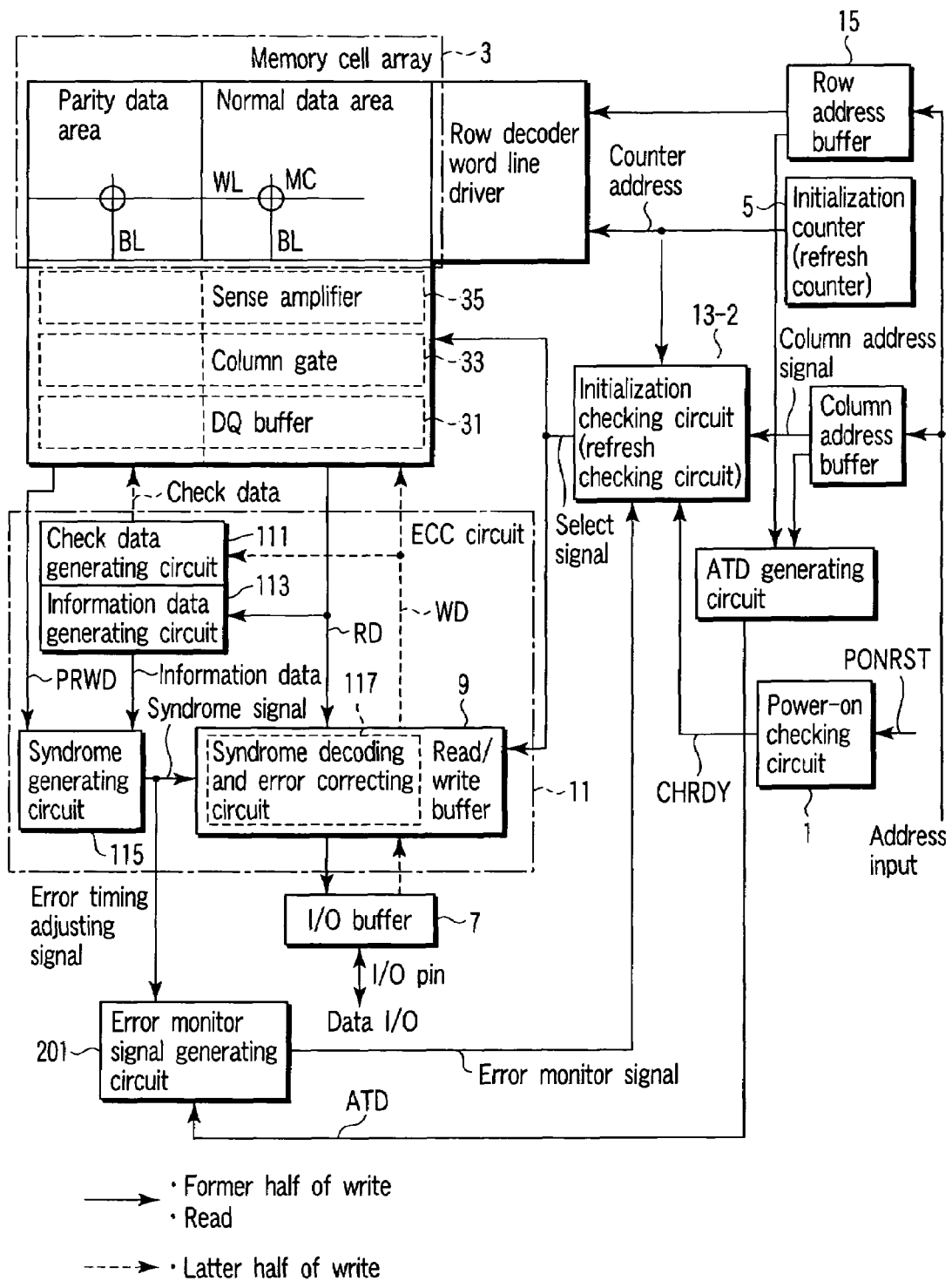
FIG. 11 is a block diagram showing the exemplary configuration of a semiconductor integrated circuit device according to a second embodiment of the present invention.

FIG. 11 is a block diagram showing the exemplary configuration of a semiconductor integrated circuit device according to a second embodiment of the present invention.

As shown in FIG. 11, the second embodiment differs from the first embodiment in that the initialization detecting circuit (refresh checking circuit) 13-2 references not only the counter address but also an error monitor signal indicating whether or not an error has occurred, in outputting the select signal. The other arrangements of the second embodiment are similar to those of the first embodiment.

The error monitor signal is generated by an error monitor signal generating circuit 201. The error monitor signal generating circuit 201 in. the present example generates an error monitor signal with reference to the syndrome signal. The error monitor signal generating circuit 201 in the present example is reset upon detecting an address transition checking signal ATD. Specifically, the error monitor signal generating circuit 201 detects the address transition checking signal ATD to determine a transition from a read operation in the former half of a write (selection based on a row address) to a write operation in the latter half of the write (selection based on a column address), and a transition from the write operation in the latter half of the write to a read operation in the former half of the next write. By detecting these transitions, the error monitor signal generating circuit 201 enables the error monitor signal generated with reference to the syndrome signal to be associated with data subjected to error checks and corrections in accordance with the syndrome signal. This enables the determination of the correct timing for a select signal generated during a write operation.

(Exemplary Operations)

Figure 12:
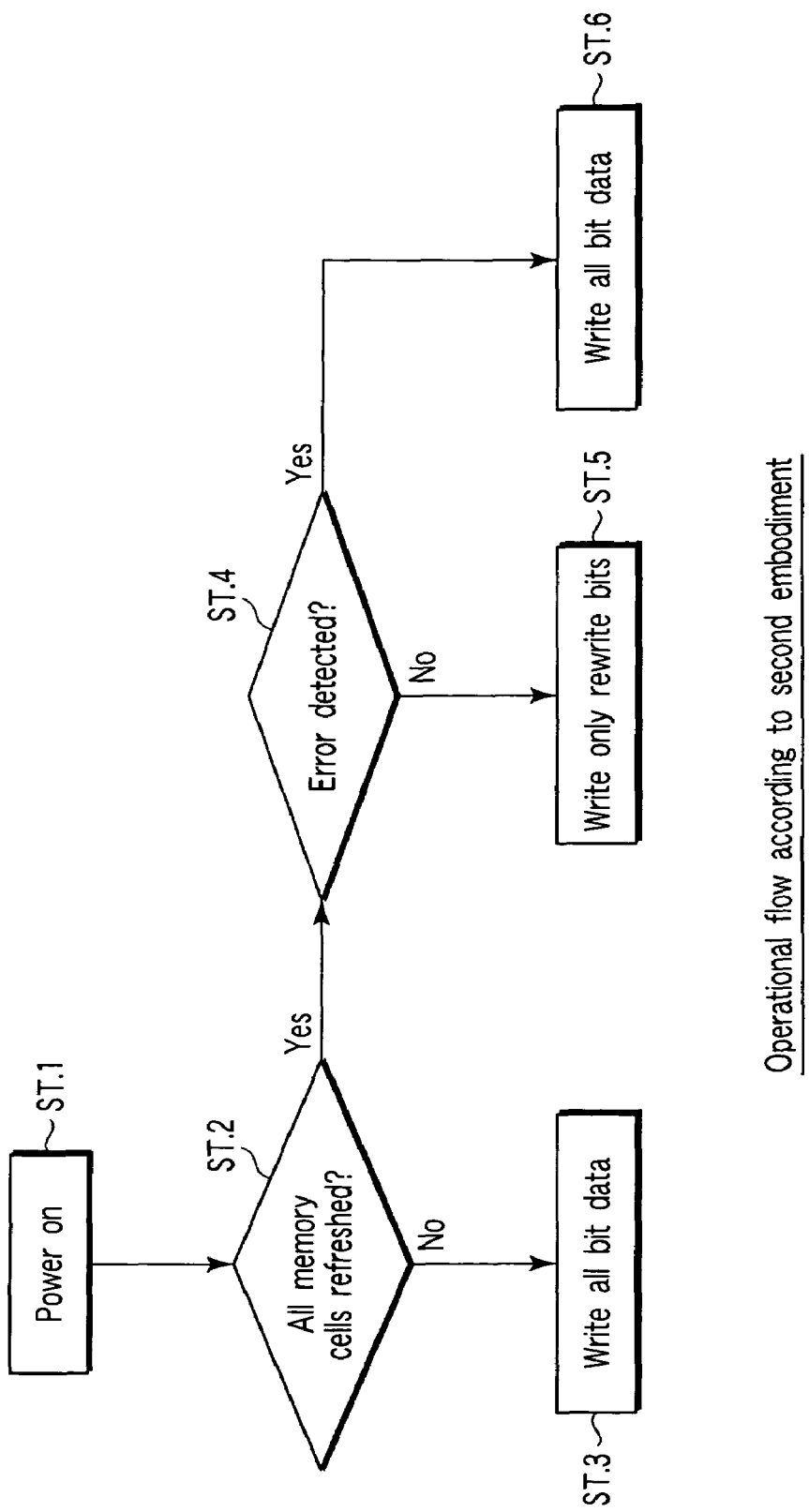
FIG. 12 is a flowchart showing the exemplary operational flow of the semiconductor integrated circuit device according to the second embodiment of the present invention.

FIG. 12 is a flowchart showing the exemplary operational flow of the semiconductor integrated circuit device according to the second embodiment of the invention.

As shown in FIG. 12, the operational flow of the second embodiment is similar to that of the first embodiment except for a procedure executed after the determination of whether or not all the memory cells have been refreshed as shown in ST. 2, particularly a procedure executed if all the memory cells have been refreshed (Yes).

In the second embodiment, if all the memory cells have been refreshed (Yes), the device determines whether or not an error is detected in the M×N-bit normal data (RD) read from the normal data area (ST. 4).

If no error is detected in the normal data (No), only the N-bit write data of the M×N-bit normal data (WD) is written to the normal data area of the memory cell array 3 (ST. 5). This operation is similar to that shown in FIG. 8 in the first embodiment.

If an error is detected in the normal data (Yes), all the bits of the M×N-bit normal data (WD) including the N-bit write data are written to the normal data area of the memory cell array 3 (ST. 3). This operation is similar to that shown in FIG. 7 in the first embodiment.

Thus, in the second embodiment, after all the memory cells are refreshed, the number of bits written to the normal data area of the memory cell array 3 is changed in the latter half of a write operation depending on whether or not an error is detected in the normal data (RD) read in the former half of the write operation.

The second embodiment makes it possible to prevent the following situation. After all the memory cells are refreshed, if an error is detected in the normal data (RD) read in the former half of a write operation, new check data generated from the normal data is different from the normal data held in the normal data area.

If no error is detected in the normal data (RD) read in the former half of the write operation, the rewritten part (in the present example, 16 bits) of the data held in the read/write buffer 9 is written to the normal data area as is the case with the first embodiment. This enables a reduction in power consumption as is the case with the first embodiment.

Of course, all the data (in the present example, 64 bits) held in the read/write buffer 9 is written to the normal data area if not all the memory cells have been refreshed. This enables the suppression of a possible multiple error immediately after power-on, thus keeping the semiconductor memory reliable, as is the case with the first embodiment.

Thus, the second embodiment not only has advantages similar to those of the first embodiment but also makes it possible to avoid executing incorrect checks and corrections on the write data as a result of a multiple error even after all the memory cells have been refreshed. The semiconductor memory can thus be kept reliable.

Now, an exemplary initialization checking circuit will be described.

Figure 13:
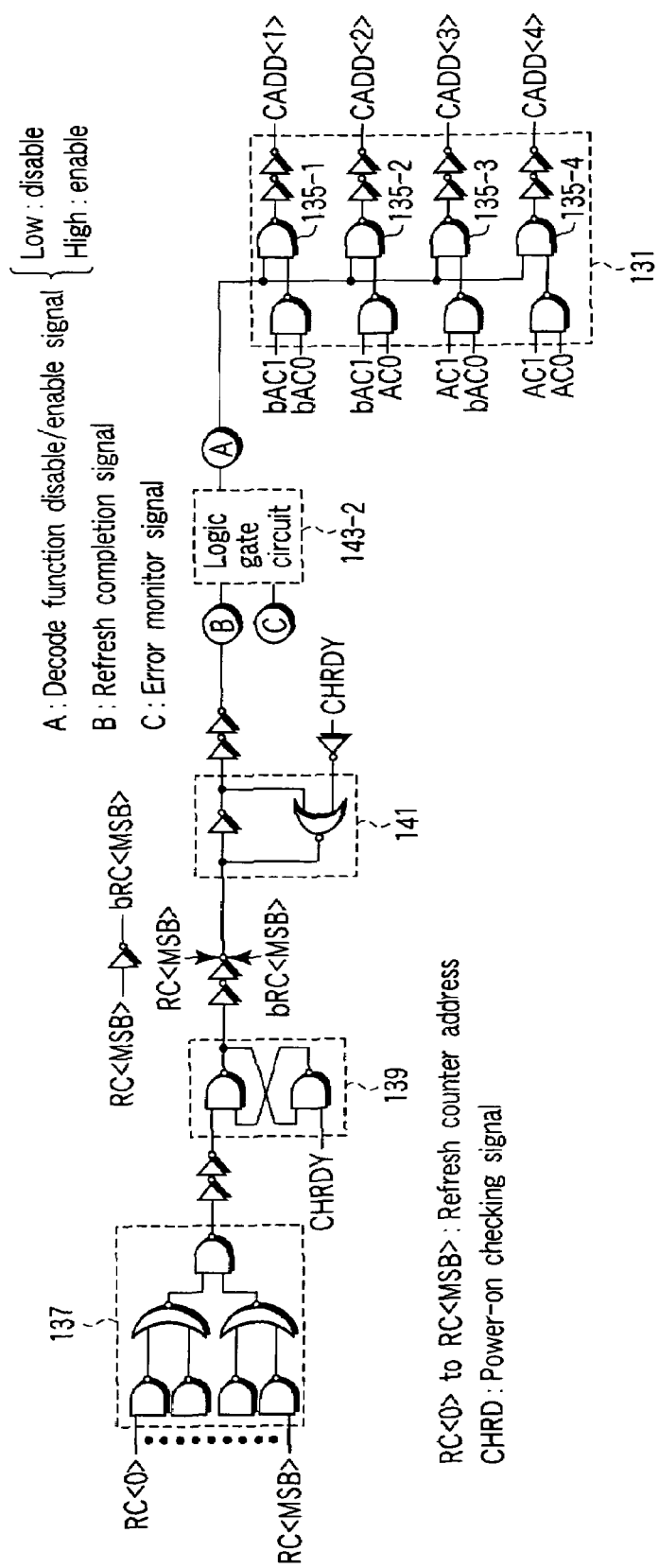
FIG. 13 is a circuit diagram showing an example of an initialization checking circuit shown in FIG. 11.

FIG. 13 is a circuit diagram showing an example of the initialization checking circuit 13-2, shown in FIG. 11.

Figure 14:
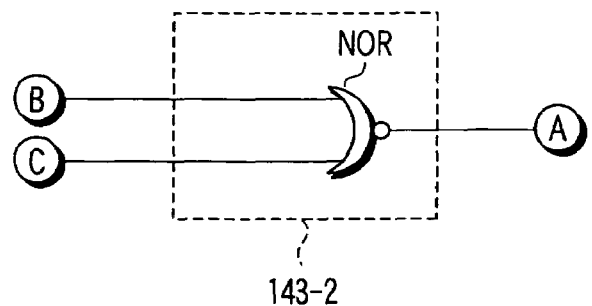
FIG. 14 is a circuit diagram showing an exemplary logic gate circuit used in the second embodiment.

As shown in FIG. 13, the initialization checking circuit 13-2 is configured almost similarly to the initialization checking circuit 13, shown in FIG. 9, except for the configuration of a logic gate circuit 143-2. The logic gate circuit 143-2 does not only generate a refresh completion signal B but also generates a decode function disable/enable signal A with reference to the error signal C. FIG. 14 shows an example of the logic gate circuit 143-2 in the present example. As shown in FIG. 14, the logic gate circuit 143-2 in the present example is a NOR gate circuit. If at least either the refresh completion signal B or error monitor signal C is high level, the logic gate circuit 143-2 generates a low level decode function disable/enable signal A. All the select signals CADD<1> to CADD<4> are thus made high level regardless of the column address signals AC0 and AC1. Only when both the refresh completion signal B and error monitor signal C are low level, the decode function disable/enable signal A is made high level. One of the select signals CADD<1> to CADD<4> thus changes to high level in accordance with the logic of the column address signals AC0 and AC1.

Now, an exemplary error monitor generating circuit will be described.

Figure 15:
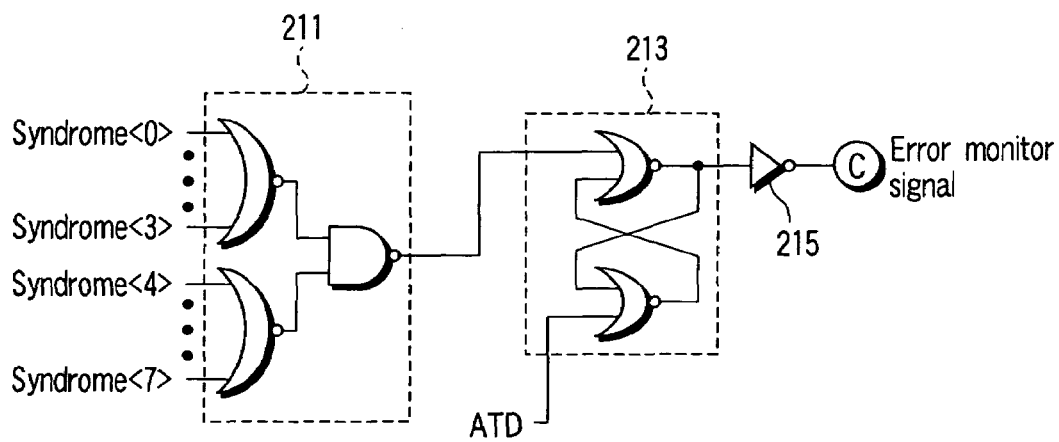
FIG. 15 is a circuit diagram showing an example of an error monitor signal generating circuit shown in FIG. 15.

FIG. 15 is a circuit diagram showing an example of the error monitor signal generating circuit shown in FIG. 11.

As shown in FIG. 15, the error monitor signal generating circuit 201 in the present example includes a syndrome detecting circuit 211 and a flip flop circuit 213. The syndrome detecting circuit 211 makes its syndrome detection output low level when all syndrome signals Syndrome <0> to <7> are made low level. This indicates that no error is occurring. Otherwise all the syndrome signals are high level. This indicates that an error is occurring. The syndrome detection output is input to the flip flop circuit 213.

The flip flop circuit 213 in the present example is composed of cross-coupled NAND gate circuits and stores a change in counter address detection output from low to high level.

For example, when the syndrome detection output is made low level, with the address transition checking signal ATD made high level, the flip flop circuit 213 is reset to change its output to the high level. The address transition checking signal ATD is, for example, a one-shot pulse that changes from high to low level. However, the flip flop circuit 213 is in a hold state to keep its output at high level. An error is subsequently detected to change the syndrome detection output from low to high level. The flip flop circuit 213 is then set to change its output from high to low level. The low level output is inverted by an inverter gate circuit to make the error monitor signal C high level. The syndrome detection output subsequently changes from high to low level. However, the flip flop circuit 213 is in the hold state to keep its output at low level. When the address transition checking signal ATD is then make high level, the flip flop circuit 213 is reset to repeat the above operations.

Third Embodiment

FIG. 16 is a flowchart showing the exemplary operational flow of a semiconductor integrated circuit device according to a third embodiment of the invention.

As shown in FIG. 16, the operational flow of the third embodiment is similar to that of the first embodiment except for a procedure executed after the determination of whether or not all the memory cells have been refreshed as shown in ST. 2, particularly a procedure executed if not all the memory cells have been refreshed (No).

In the third embodiment, if not all the memory cells have been refreshed (No), the device determines whether or not an error is detected in the M×N-bit normal data (RD) read from the normal data area (ST. 3).

If no error is detected in the normal data (No), only the N-bit write data of the M×N-bit normal data (WD) is written to the normal data area of the memory cell array 3 (ST. 4). This operation is similar to that shown in FIG. 8 in the first embodiment.

If an error is detected in the normal data (Yes), all the bits of the M×N-bit normal data (WD) including the N-bit write data are written to the normal data area of the memory cell array 3 (ST. 5). This operation is similar to that shown in FIG. 7 in the first embodiment.

In the third embodiment, if all the memory cells have been refreshed, only the N-bit write data of the M×N-bit normal data (WD) is written to the normal data area of the memory cell array 3 (ST. 6), as is the case with the first embodiment.

Thus, in the third embodiment, if not all the memory cells have been refreshed, the number of bits written to the normal data area in the latter half of a write operation is changed depending on whether or not an error is detected in the normal data (RD) read in the former half of the write operation.

In the third embodiment, even if not all the memory cells have been refreshed, when no error is detected, only the rewrite bit data is written. The third embodiment thus further reduces power consumption compared to the first embodiment.

As is the case with the second embodiment, the initialization checking circuit for the third embodiment is configured to, for example, reference the error monitor signal as shown in FIG. 13. However, the logic gate circuit 143-2, shown in FIG. 13, is composed of a NAND gate circuit similarly to, for example, a logic gate circuit 143-3 shown in FIG. 17. If both the refresh completion signal B and error monitor signal C are high level, the decode function disable/enable signal A is made low level. All the select signals CADD<1> to CADD<4> are thus made high level regardless of the column address signals AC0 and AC1. Only when at least either the refresh completion signal B or error monitor signal C is low level, the decode function disable/enable signal A changes to high level. One of the select signals CADD<1> to CADD<4> thus changes to low level in accordance with the logic of the column address signals AC0 and AC1.

Fourth Embodiment

A fourth embodiment enables either the second embodiment functions or third embodiment functions to be selected. As is the case with the second and third embodiments, the initialization checking circuit for the fourth embodiment may be configured to, for example, reference the error monitor signal as shown in FIG. 13. An exemplary circuit is shown in FIG. 18.

As shown in FIG. 18, a logic gate circuit 143-4 in the fourth embodiment has, for example, both a NOR and NAND circuits on one integrated circuit chip.

If the logic gate circuit 143-4 selects the second embodiment functions, an output from the counter address detecting circuit (in the present example, the refresh completion signal B) and an output from the error monitor signal detecting circuit (in the present example, the error monitor signal C) are input to the NOR gate circuit. The decode function disable/enable signal A is obtained from an output from the NOR gate circuit.

If the logic gate circuit 143-4 selects the third embodiment functions, the output from the counter address detecting circuit and the output from the error monitor signal detecting circuit are input to the NAND gate circuit. The decode function disable/enable signal A is obtained from an output from the NAND gate circuit.

The selection of the functions can be achieved by, for example, in a step of forming wiring for the integrated circuit device, connecting the wiring to either the NOR or NAND gate circuit.

Now, a variation of the fourth embodiment will be described.

This variation enables either the second or third embodiment functions to be selected even after the integrated circuit chip is completed. An exemplary circuit is shown in FIG. 19.

As shown in FIG. 19, the logic gate circuit 143-3 in the variation has a NOR and NAND gate circuits similarly to the logic gate circuit 143-4, shown in FIG. 18. However, the refresh completion signal B and error monitor signal C are input to both the NOR and NAND gate circuits. Outputs from the NOR and NAND gate circuits are input a switch circuit 153. The switch circuit 153 selects either the NOR or NAND gate output as a decode function disable/enable signal. In the present example, an output from a fuse circuit 151 determines whether the switch circuit 153 selects either the NOR or NAND gate circuit output. The fuse circuit 151 has a fuse F. Depending on whether or not the fuse in the fuse circuit 151 is cut, the switch selects either the NOR or NAND gate circuit. The fuse circuit 151 in the present example selects the second embodiment functions when the fuse F is cut, and selects the third embodiment functions when the fuse F is not cut. Cutting or non-cutting of the fuse F can be carried out even after the integrated circuit chip has been completed. This refers to, for example, cutting/non-cutting of a fuse in a redundancy circuit in a semiconductor memory.

The fuse F may have its electric passage mechanically destroyed (cut) by applying energy from outside the integrated circuit chip to the fuse F as in the case of a laser blowout fuse or applying energy from inside the integrated circuit chip to the fuse F as in the case of a current blowout fuse. Instead of the fuse that has its current passage mechanically destroyed, the fuse F may be, for example, an electric element that can bring its current passage into either a "connected" or "unconnected" state.

The fourth embodiment thus enables either the second or third embodiment functions to be selected.

Moreover, the variation of the fourth embodiment enables either the second or third embodiment functions to be selected even after the integrated circuit chip has been completed.

(Fifth Embodiment)

A fifth embodiment is an example in which the semiconductor integrated circuit devices according to the first to fourth embodiments are modified.

Figure 20:
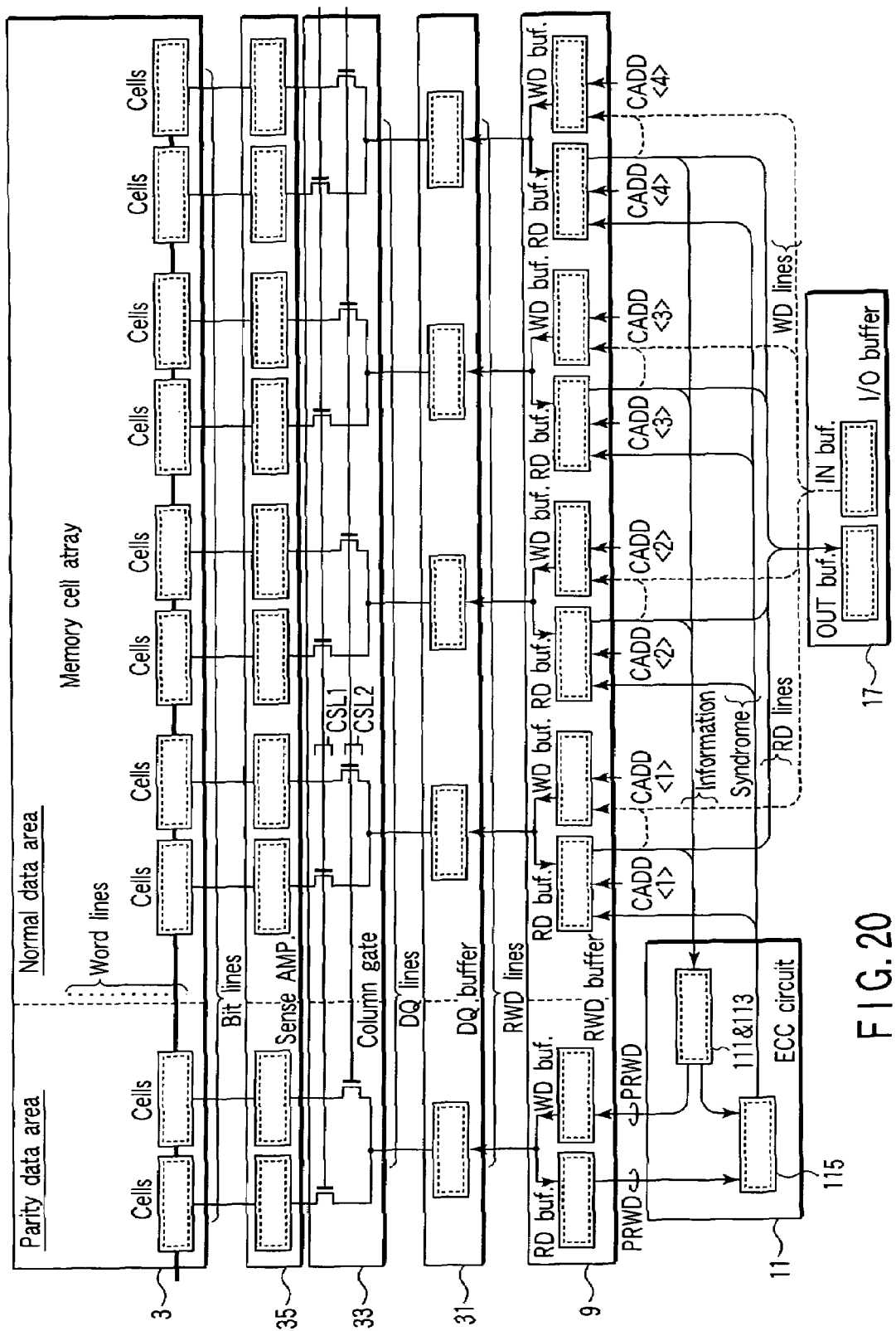
FIG. 20 is a circuit diagram showing an exemplary circuit in a semiconductor integrated circuit device according to the fifth embodiment.

FIG. 20 is a circuit diagram showing an exemplary circuit in a semiconductor integrated circuit device according to the fifth embodiment.

As shown in FIG. 20, the fifth embodiment differs from the first to fourth embodiments in that the read/write buffer (RWD buffer) 9 includes a read buffer (RD buf.) and a write buffer (WD buf.) and in that the I/O buf. 7 includes an output buffer (OUT buf.) and an input buffer (IN buf.).

The IN buf. is supplied with write data. The output of the IN buf. is connected to the input of the WD buf. via WD lines. The WD buf. holds write data output by the IN buf. The output of the WD buf. is connected to a DQ buffer. 31 via RWD lines. The DQ buffer 31 holds write data output by the IN buf. The DQ buffer 31 is connected to a sense amplifier 35 via DQ lines and a column gate 33. The column gate 33 is selected by a column select line CSL, and the sense amplifier 35 belonging to the selected column is connected to the DQ buffer 33. The present example provides two column select lines CSL1 and CSL2, but the number of column select lines is not limited to two. Write data is supplied to and held in the selected sense amplifier 35. The sense amplifier 35 is connected to bit lines. A plurality of cells are connected to the bit lines. When a word line changes to, for example, the high level, the memory cells connected to this word line are selected and read data read from the selected memory cells is transferred to the sense amplifier 35 via the bit lines. The sense amplifier 35 amplifies and holds the read data. During a refresh operation, the data amplified by and held in the sense amplifier 35 is read and written back. During a read operation, the data amplifier by and held in the sense amplifier 35 is supplied to and held in the DQ buffer 31 via the column gate 33 and DQ lines. The DQ buffer 31 is connected to the input of the RD buf. via the RWD lines. The read data held in the DQ buffer 31 is supplied to and held in the RD buf. via the RWD lines. ECC is executed on the data held in the read buffer. The output of the RD buf. is connected to the input of the OUT buf. via RD lines. ECC read data on which ECC has been executed is supplied to and held in the OUT buf. ECC read data held in the OUT buf. is output to, for example, the exterior of the semiconductor integrated circuit device.

The output of the WD buf. can be connected to the input of the RD buf. In contrast, the output of the RD buf. can be connected to the input of the WD buf. This usage of the WD buf. and RD buf. will be introduced in connection with the operation procedure described below.

FIGS. 21A to 21D are diagrams showing an exemplary procedure of an initializing operation of the semiconductor integrated circuit device according to the fifth embodiment. FIGS. 21A to 21D show movement of data inside the semiconductor integrated circuit device according to a main procedure.

Figure 21A:
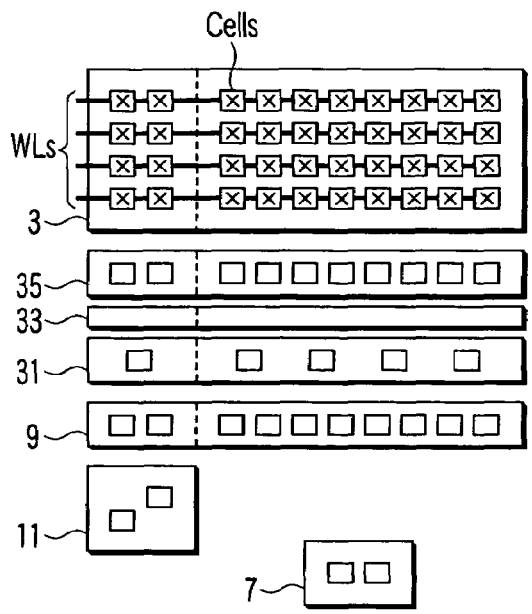
FIGS. 21A to 21D are diagrams showing an exemplary procedure of an initializing operation of the semiconductor integrated circuit device according to the fifth embodiment.

FIG. 21A shows a state prior to power-on. Cells are volatile as is the case with the first to fourth embodiments. It is unspecified whether the data held in the volatile cell is "0" or "1" before power-on. Unspecified data is denoted by "x" in the figure. The data held in all the memory cells integrated into the memory cell array 3 is unspecified as shown in FIG. 21A. After power-on, an initializing operation is started to determine the unspecified held data to be "0" or "1".

Figure 21C:
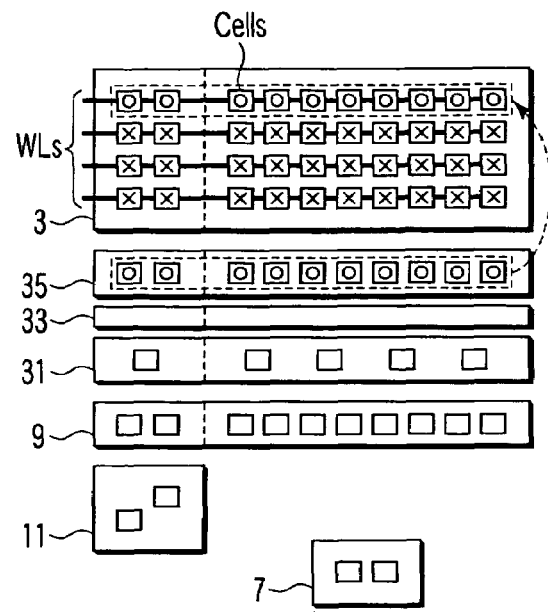
Figure 21B:
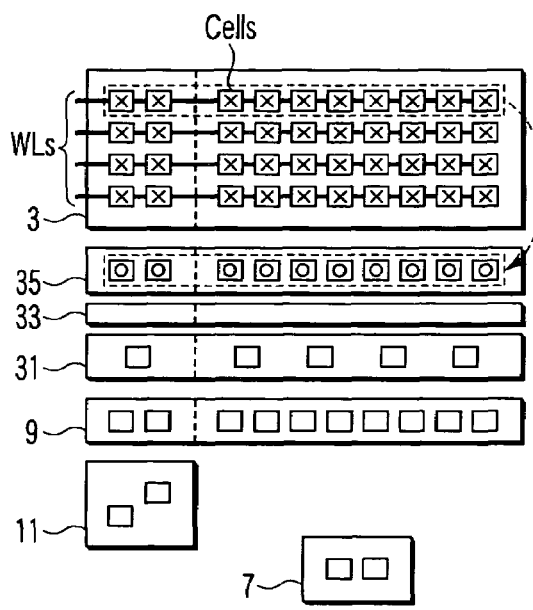

First, as shown in FIG. 21B, one of the plurality of word lines (WLs) is selected (row). Read data is then read from the cells connected to the selected WL, to the sense amplifier 35, which amplifies and holds the read data. The exemplary circuit of the sense amplifier 35 is not particularly shown but is a cross couple type latch circuit.

Then, as shown in FIG. 21C read data held in the sense amplifier 35 is written back to cells from which the read data have been read.

This initializing operation is performed on all the cells of the memory cell array 3.

Figure 21D:
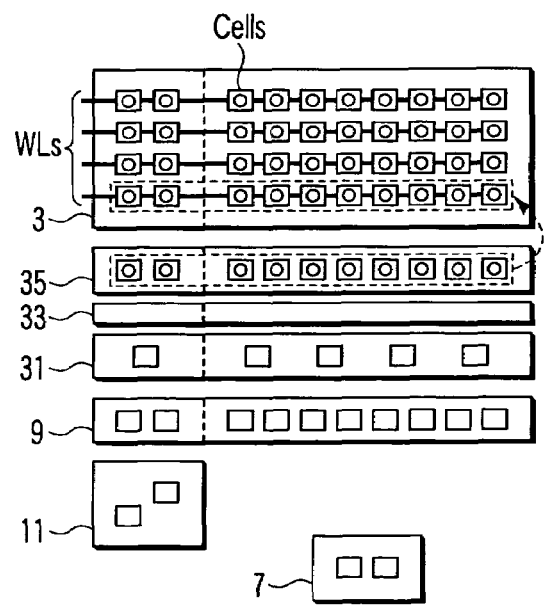

FIG. 21D shows that the initializing operation has been completed on all the cells.

In the state shown in FIG. 21D, the held data is determined in all the cells integrated into the memory cell array 3.

FIGS. 22A to 22F are diagrams showing that a data write operation is performed during an initializing operation of the semiconductor integrated circuit device according to the fifth embodiment.

Figure 22A:
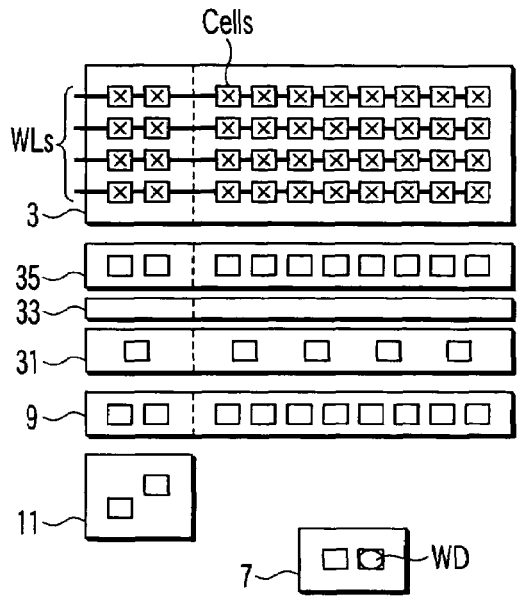

FIG. 22A is a state before completion of initialization. FIG. 22A shows, for example, the same state as that shown in FIG. 21A.

Figure 22C:
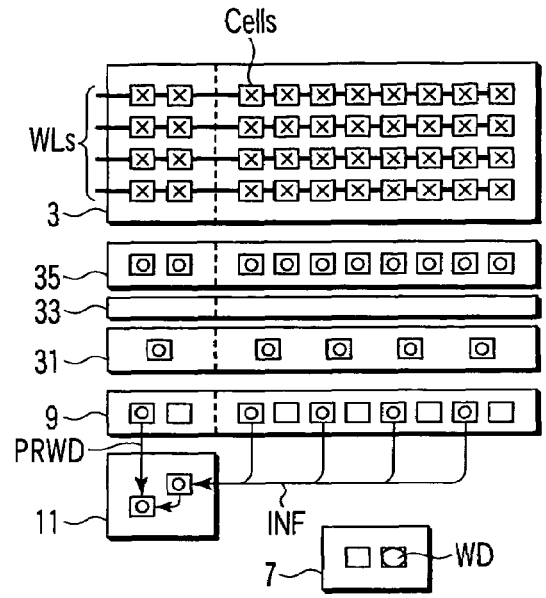
Figure 22B:
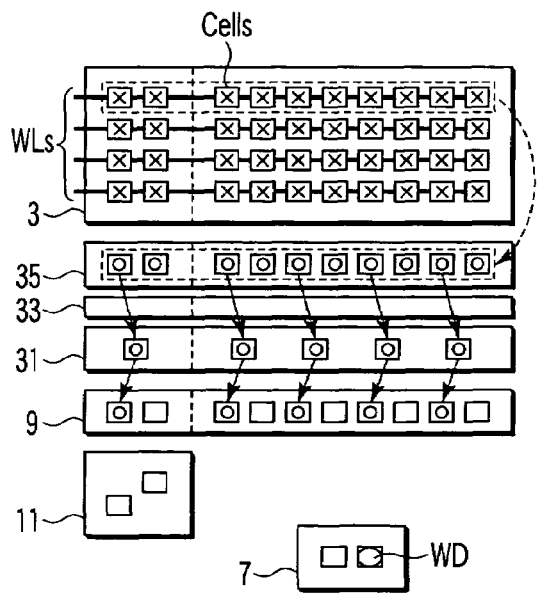

First, as shown in FIG. 22B, in accordance with the operation described with reference to FIG. 21B, read data is then read from the cells connected to the selected WL, to the sense amplifier 35, which amplifies and holds the read data. Then, one of the plurality of columns (in the present example, the two columns CSL1 and CSL2) is selected via the column gate 33. The read data belonging to the selected column is transferred from the sense amplifier 35 to the DQ buffer 31, which then holds the read data. Then, the read data transferred to the DQ buffer 31 is transferred to and held in the RD buf. in the RWD buffer 9.

Then, as shown in FIG. 22C, information data (INF) is generated from that of the read data held in the read buffer which has been read from a normal data area. INF is then transferred to an ECC circuit 11. The ECC circuit 11 is then used to generate a syndrome signal (SYN) from INF and parity data read from a parity data area.

Figure 22D:
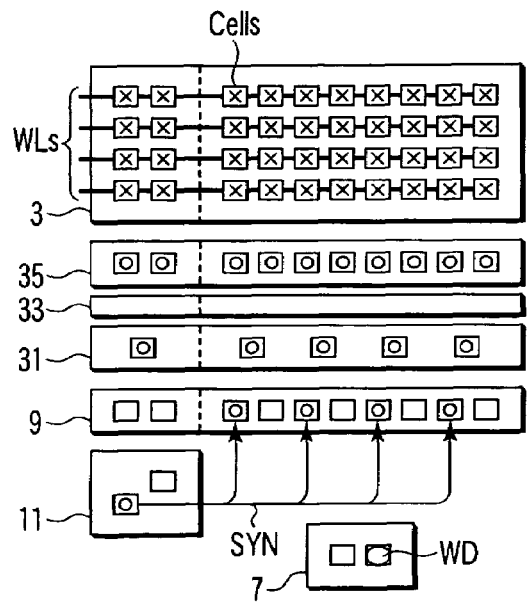

Then, as shown in FIG. 22D, ECC is executed on the read data held in the RD buf. on the basis of SYN.

Then, as shown in FIG. 22E, write data (WD) held in the IN buf. in the I/O buffer 7 is transferred and held in the WD buf. in the RWD buffer 9. WD transferred to the WD buf. is then transferred to the RD buf. in the RWD buffer 9, which then overwrites the ECC read data with WD and holds the resulting data. INF is then generated from WD held in the RD buf. and ECC data and is transferred to the ECC circuit 11.

Then, as shown in FIG. 22F, INF transferred to the ECC circuit 11 is transferred to and held in the WD buf. in the RWD buffer 9 which belongs to the parity data area. The ECC read data held in the RD buf. in the RWD buffer 9 which belongs to the normal data area is transferred to and held in the RD buf. Then, data held in the WD buf. is transferred to and held in the DQ buffer 31. Then, data held in the DQ buffer 31 is transferred to and held in the sense amplifier 35 from which the read data has been read. Then, ECC read data held in the sense amplifier 35 is written back to cells from which the read data have been read.

FIGS. 23A to 23F are diagrams showing that a data write operation is performed after completion of an initializing operation of the semiconductor integrated circuit device according to the fifth embodiment.

Figure 23A:
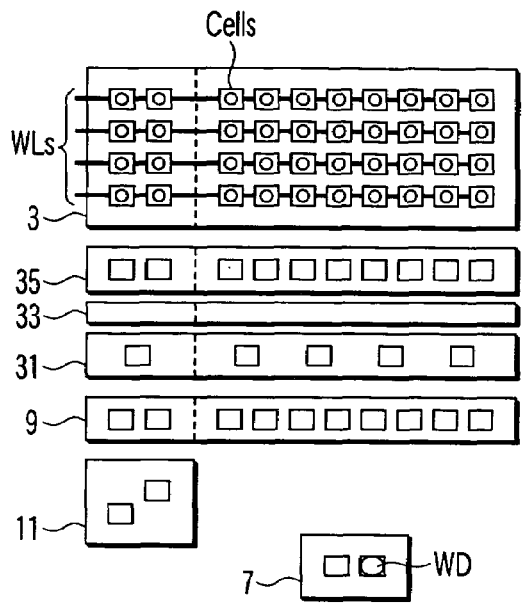
FIGS. 23A to 23F are diagrams showing that a data write operation is performed after completion of an initializing operation of the semiconductor integrated circuit device according to the fifth embodiment.

FIG. 23A is a state after completion of initialization. FIG. 23A shows, for example, the same state as that shown in FIG. 21N.

Figure 23C:
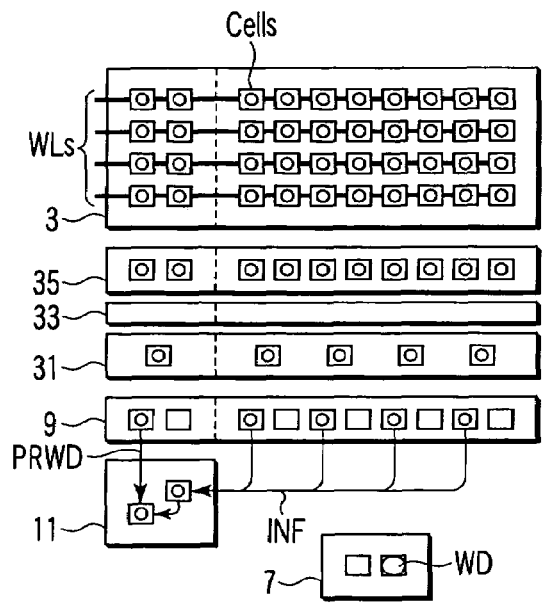
Figure 23B:
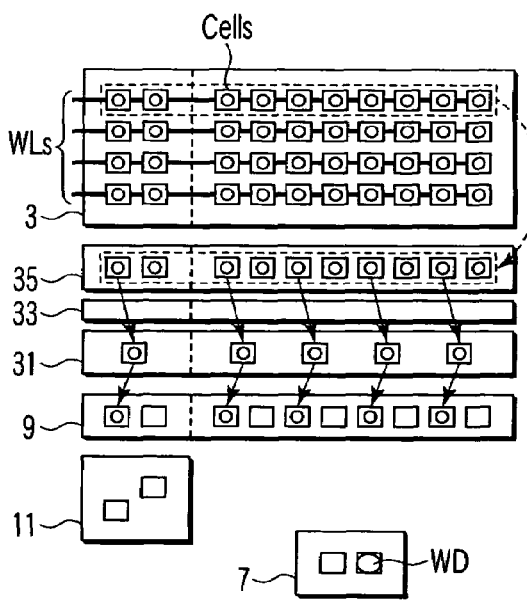

First, as shown in FIG. 23B, in accordance with the operation described with reference to FIG. 22B, read data read from a selected WL (row) and belonging to a selected column is transferred to and held in the RD buf in the RWD buffer 9.

Then, as shown in FIG. 23C, in accordance with the operation described with reference to FIG. 22C, SYN is generated from INF and the parity data read from the parity data area.

Figure 23D:
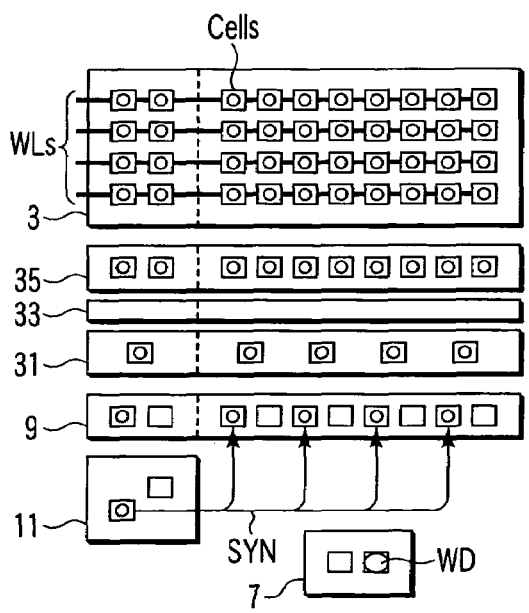

Then, as shown in FIG. 23D, in accordance with the operation described with reference to FIG. 22D, ECC is executed on the read data held in the RD buf. on the basis of SYN.

Figure 23E:
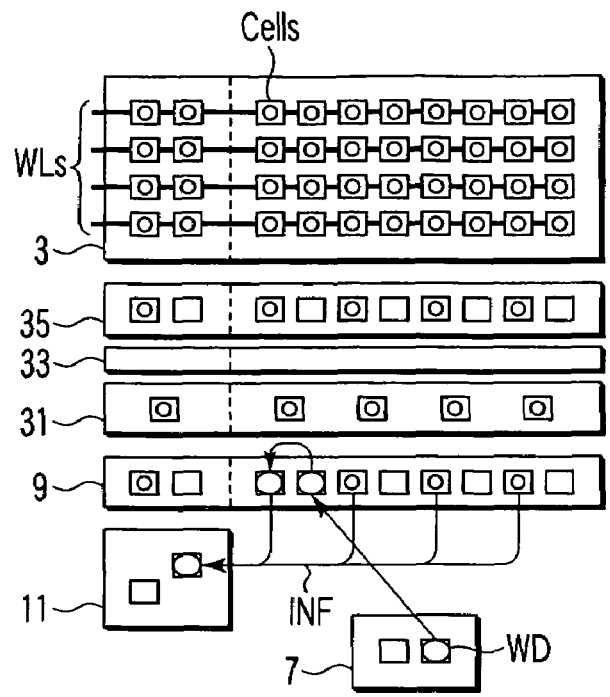

Then, as shown in FIG. 23E, write data (WD) held in the IN buf. in the I/O buffer 7 is transferred and held in the WD buf. in the RWD buffer 9. WD transferred to the WD buf. is then transferred to the RD buf. in the RWD buffer 9, which then overwrites its data with WD and holds the resulting data. INF is then generated from WD held in the RD buf. and ECC data and is transferred to the ECC circuit 11.

Figure 23F:
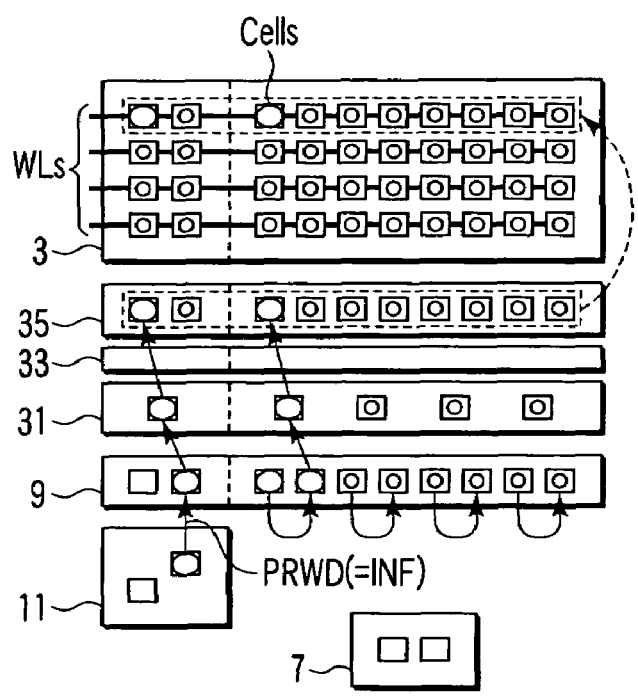

Then, as shown in FIG. 23F, INF transferred to the ECC circuit 11 is transferred to and held in the RD buf. in the RWD buffer 9 which belongs to the parity data area; INF is then used as parity data.

The above operations are the same as those described with reference to FIGS. 22A to 22F. Differences are as follows. Only WD held in the RD buf. in the RWD buffer 9 which belongs to the normal data area is transferred to the sense amplifier 35. The data in the sense amplifier is overwritten only with WD. ECC read data held in RD buf. belonging to the normal data area is not transferred to the sense amplifier 9. For the data other than WD, the read data held in the sense amplifier 9 as a result of the procedure shown in FIG. 23B is utilized. The read data held in the sense amplifier 35 is written back to cells from which the read data has been read. The overwritten WD is also written to write target cells.

The above embodiments can thus provide a semiconductor integrated circuit device comprising a semiconductor memory that reduces power consumption while minimizing adverse effects on accesses.

The present invention has been described in conjunction with the first to fourth embodiments. However, the present invention is not limited to these embodiments. In implementation, the embodiments can be varied without departing from the spirit of the present invention.

The embodiments can be independently carried out but may be appropriately combined together.

Each of the embodiments includes various levels of inventions. Various levels of inventions can be extracted by appropriately combining a plurality of the components disclosed in each embodiment.

The embodiments have been described on the basis of the example in which the present invention is applied to a semiconductor memory having dynamic memory cells, for example, a DRAM or a pseudo SRAM. However, the present invention is not limited to the DRAM or pseudo SRAM but is applicable to other semiconductor memories. For example, since the data in a volatile semiconductor memory is unstable immediately after power-on, the present invention can be used for general volatile semiconductor memories, for example, SRAMs. The present invention can also be used for nonvolatile semiconductor memories that desirably execute data initialization, for example, data restoration immediately after power-on. These nonvolatile memories include a destructive read type. The destructive read nonvolatile semiconductor memory destroys read data. For example, the DRAM and pseudo SRAM are of the destructive read type. The destructive-read nonvolatile memories include, for example, FeRAMs. The scope of the present invention also includes semiconductor integrated circuit devices containing these semiconductor memories, for example, processors and system LSIs.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor integrated circuit device comprising:
   a power-on checking circuit which detects power-on;
   a memory cell array in which memory cell arrays are integrated;
   an initialization counter which sequentially counts addresses of the memory cell arrays and which initializes data in the memory cells integrated in the memory cell array in accordance with the counter;
   an I/O buffer to which N-bit data is input and which outputs N-bit data (N is a natural number equal to or larger than 1);
   a read/write buffer configured to hold M×N-bit data and to which the I/O buffer inputs N-bit data at a time and which outputs N-bit data to the I/O buffer at a time, the memory cell array inputting up to M×N-bit data to the read/write buffer, the read/write buffer outputting up to M×N-bit data to the memory cell array, the read/write buffer writing a variable number of bits to the memory cell array (M is a natural number equal to or larger than 2);
   an error checking and correcting circuit which checks whether or not an error is detected in the M×N-bit data from the memory cell array and which, when an error is detected, corrects the detected error; and
   an initialization checking circuit which, after the power-on checking circuit detects power-on, determines whether or not the initialization counter has initialized the data in all the memory cells.

2. The device according to claim 1, wherein the number of data bits written to the memory cell array during a write operation is varied between before and after completion of the initialization.

3. The device according to claim 1, wherein when the write operation is performed before the initialization is completed, all of the M×N-bit data including N-bit write data is written to the memory cell arrays, the M×N-bit data being held in the read/write buffer, and when the write operation is performed after the initialization is completed, only the N-bit write data held in the read/write buffer is written to the memory cell array.

4. The device according to claim 1, wherein when the write operation is performed before the initialization is completed, all of the M×N-bit data including N-bit write data is written to the memory cell arrays, the M×N-bit data being held in the read/write buffer, when the write operation is performed after the initialization is completed and the error checking and correcting circuit has not corrected any errors, only the N-bit write data held in the read/write buffer is written to the memory cell array, and when the write operation is performed after the initialization is completed and the error checking and correcting circuit has corrected an error, all of the M×N-bit data including N-bit write data is written to the memory cell arrays, the M×N-bit data being held in the read/write buffer.

5. The device according to claim 1, wherein when the write operation is performed before the initialization is completed and the error checking and correcting circuit has not corrected any errors, only the N-bit write data held in the read/write buffer is written to the memory cell array, when the write operation is performed before the initialization is completed and the error checking and correcting circuit has corrected an error, all of the M×N-bit data including N-bit write data is written to the memory cell arrays, the M×N-bit data being held in the read/write buffer, and when the write operation is performed after the initialization is completed, only the N-bit write data held in the read/write buffer is written to the memory cell array.

6. The device according to claim 1, wherein when the write operation is performed before the initialization is completed and the error checking and correcting circuit has not corrected any errors, only the N-bit write data held in the read/write buffer is written to the memory cell array, when the write operation is performed before the initialization is completed and the error checking and correcting circuit has corrected an error, all of the M×N-bit data including N-bit write data is written to the memory cell arrays, the M×N-bit data being held in the read/write buffer, and when the write operation is performed after the initialization is completed and the error checking and correcting circuit has corrected an error, all of the M×N-bit data including N-bit write data is written to the memory cell arrays, the M×N-bit data being held in the read/write buffer.

7. The device according to claim 1, wherein the error checking and correcting circuit comprises:

a check data generating circuit to which the M×N-bit data is input by the read/write buffer and which generates check data for error checks and corrections, from the input M×N-bit data;

an information data generating circuit to which the M×N-bit data is input by the normal data area and which generates information data for error checks and corrections, from the input M×N-bit data;

a syndrome generating circuit which generates a syndrome signal on the basis of the information data from the information data generating circuit and the check data from the parity data area; and an error checking and correcting circuit which subjects the M×N-bit data from the normal data area to error checks and corrections on the basis of the syndrome signal and which causes the read/write buffer to hold the M×N-bit data subjected to the error checks and corrections.

8. The device according to claim 2, wherein the error checking and correcting circuit comprises:

a check data generating circuit to which the M×N-bit data is input by the read/write buffer and which generates check data for error checks and corrections, from the input M×N-bit data;

an information data generating circuit to which the M×N-bit data is input by the normal data area and which generates information data for error checks and corrections, from the input M×N-bit data;

a syndrome generating circuit which generates a syndrome signal on the basis of the information data from the information data generating circuit and the check data from the parity data area; and an error checking and correcting circuit which subjects the M×N-bit data from the normal data area to error checks and corrections on the basis of the syndrome signal and which causes the read/write buffer to hold the M×N-bit data subjected to the error checks and corrections.

9. The device according to claim 3, wherein the error checking and correcting circuit comprises:

a check data generating circuit to which the M×N-bit data is input by the read/write buffer and which generates check data for error checks and corrections, from the input M×N-bit data;

an information data generating circuit to which the M×N-bit data is input by the normal data area and which generates information data for error checks and corrections, from the input M×N-bit data;

a syndrome generating circuit which generates a syndrome signal on the basis of the information data from the information data generating circuit and the check data from the parity data area; and an error checking and correcting circuit which subjects the M×N-bit data from the normal data area to error checks and corrections on the basis of the syndrome signal and which causes the read/write buffer to hold the M×N-bit data subjected to the error checks and corrections.

10. The device according to claim 4, wherein the error checking and correcting circuit comprises:

a check data generating circuit to which the M×N-bit data is input by the read/write buffer and which generates check data for error checks and corrections, from the input M×N-bit data;

an information data generating circuit to which the M×N-bit data is input by the normal data area and which generates information data for error checks and corrections, from the input M×N-bit data;

a syndrome generating circuit which generates a syndrome signal on the basis of the information data from the information data generating circuit and the check data from the parity data area; and an error checking and correcting circuit which subjects the M×N-bit data from the normal data area to error checks and corrections on the basis of the syndrome signal and which causes the read/write buffer to hold the M×N-bit data subjected to the error checks and corrections.

11. The device according to claim 5, wherein the error checking and correcting circuit comprises:

a check data generating circuit to which the M×N-bit data is input by the read/write buffer and which generates check data for error checks and corrections, from the input M×N-bit data;

an information data generating circuit to which the M×N-bit data is input by the normal data area and which generates information data for error checks and corrections, from the input M×N-bit data;

a syndrome generating circuit which generates a syndrome signal on the basis of the information data from the information data generating circuit and the check data from the parity data area; and an error checking and correcting circuit which subjects the M×N-bit data from the normal data area to error checks and corrections on the basis of the syndrome signal and which causes the read/write buffer to hold the M×N-bit data subjected to the error checks and corrections.

12. The device according to claim 6, wherein the error checking and correcting circuit comprises:

a check data generating circuit to which the M×N-bit data is input by the read/write buffer and which generates check data for error checks and corrections, from the input M×N-bit data;

an information data generating circuit to which the M×N-bit data is input by the normal data area and which generates information data for error checks and corrections, from the input M×N-bit data;

a syndrome generating circuit which generates a syndrome signal on the basis of the information data from the information data generating circuit and the check data from the parity data area; and an error checking and correcting circuit which subjects the M×N-bit data from the normal data area to error checks and corrections on the basis of the syndrome signal and which causes the read/write buffer to hold the M×N-bit data subjected to the error checks and corrections.

* * * * *